(12) United States Patent
Matsuda

(10) Patent No.: US 8,705,583 B2
(45) Date of Patent: Apr. 22, 2014

(54) SEMICONDUCTOR LASER

(75) Inventor: Manabu Matsuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 433 days.

(21) Appl. No.: 12/753,987

(22) Filed: Apr. 5, 2010

(65) Prior Publication Data
US 2010/0265980 A1 Oct. 21, 2010

(30) Foreign Application Priority Data
Apr. 17, 2009 (JP) ................................. 2009-101072

(51) Int. Cl.
*H01S 5/026* (2006.01)
*H01S 5/125* (2006.01)

(52) U.S. Cl.
USPC .................... 372/50.11; 372/46.01; 372/50.1; 372/50.22

(58) Field of Classification Search
USPC .......................... 372/46.01, 50.1, 50.11, 50.22
See application file for complete search history.

(56) References Cited

U.S. PATENT DOCUMENTS

| | | | | |
|---|---|---|---|---|
| 5,164,956 | A * | 11/1992 | Lang | 372/96 |
| 6,330,265 | B1 * | 12/2001 | Kinoshita | 372/50.12 |
| 2004/0136415 | A1 * | 7/2004 | Park et al. | 372/20 |
| 2004/0247000 | A1 * | 12/2004 | Carter et al. | 372/20 |
| 2005/0053102 | A1 * | 3/2005 | Reid | 372/20 |

FOREIGN PATENT DOCUMENTS

| | | |
|---|---|---|
| JP | 61-171190 A | 8/1986 |
| JP | 63-228795 A | 9/1988 |
| JP | 5-48214 A | 2/1993 |
| JP | 6-53591 A | 2/1994 |
| JP | 6-175169 A | 6/1994 |
| JP | 10-242580 A | 9/1998 |
| JP | 2000-124543 A | 4/2000 |
| JP | 2000-286502 A | 10/2000 |
| JP | 2002-353559 A | 12/2002 |
| JP | 2003-110194 A | 4/2003 |
| JP | 2004-221219 A | 8/2004 |
| JP | 2008-205409 A | 9/2008 |

OTHER PUBLICATIONS

K. Nakahara et al. "High Extinction Ratio Operation at 40-Gb/s Direct Modulation in 1.3-μm InGaAlAs-MQW RWG DFB Lasers", OFC/NFOEC, 2006, OWC5.
Japanese Office Action dated Nov. 20, 2012, issued in corresponding Japanese patent application No. 2009-101072, w/ English translation.

* cited by examiner

*Primary Examiner* — Armando Rodriguez
*Assistant Examiner* — Michael Carter
(74) *Attorney, Agent, or Firm* — Westerman, Hattori, Daniels & Adrian, LLP

(57) ABSTRACT

A semiconductor laser includes an active region including an active layer, and a diffraction grating and a phase shift which determine an oscillation wavelength, and a distributed reflector region including a light guide layer and a refection diffraction grating. The distributed reflector region has an effective diffraction grating period which varies along a direction of a cavity.

18 Claims, 32 Drawing Sheets

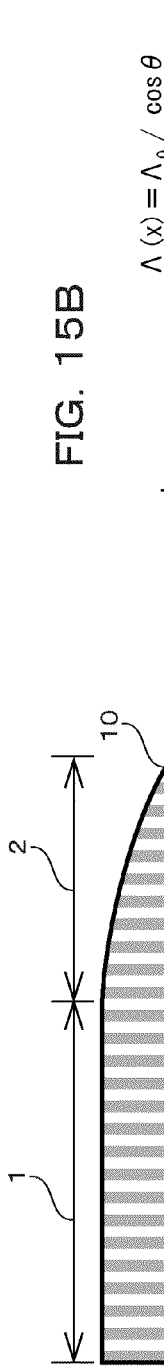
FIG. 15A
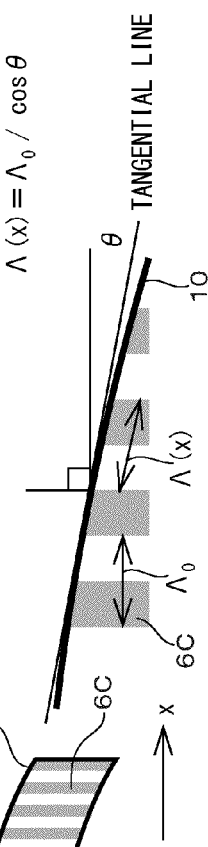
FIG. 15B
$$\Lambda(x) = \Lambda_0 / \cos\theta$$
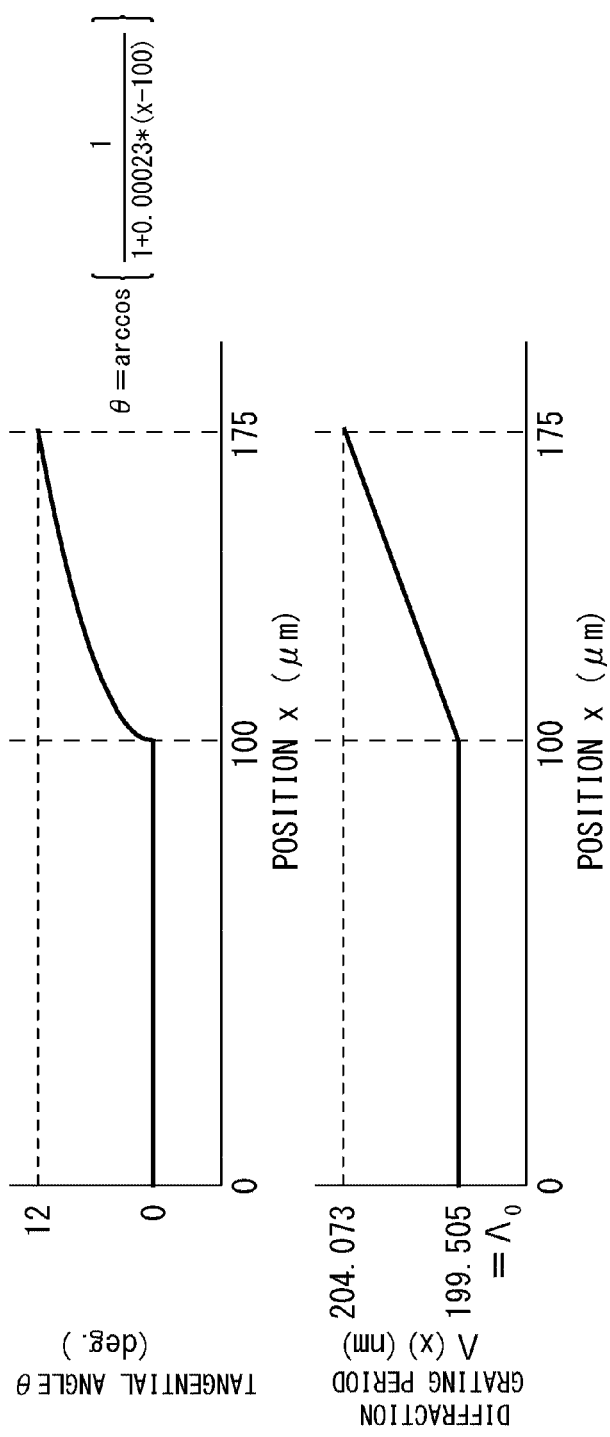
FIG. 15C
$$\theta = \arccos\left\{\frac{1}{1+0.00023*(x-100)}\right\}$$
FIG. 15D

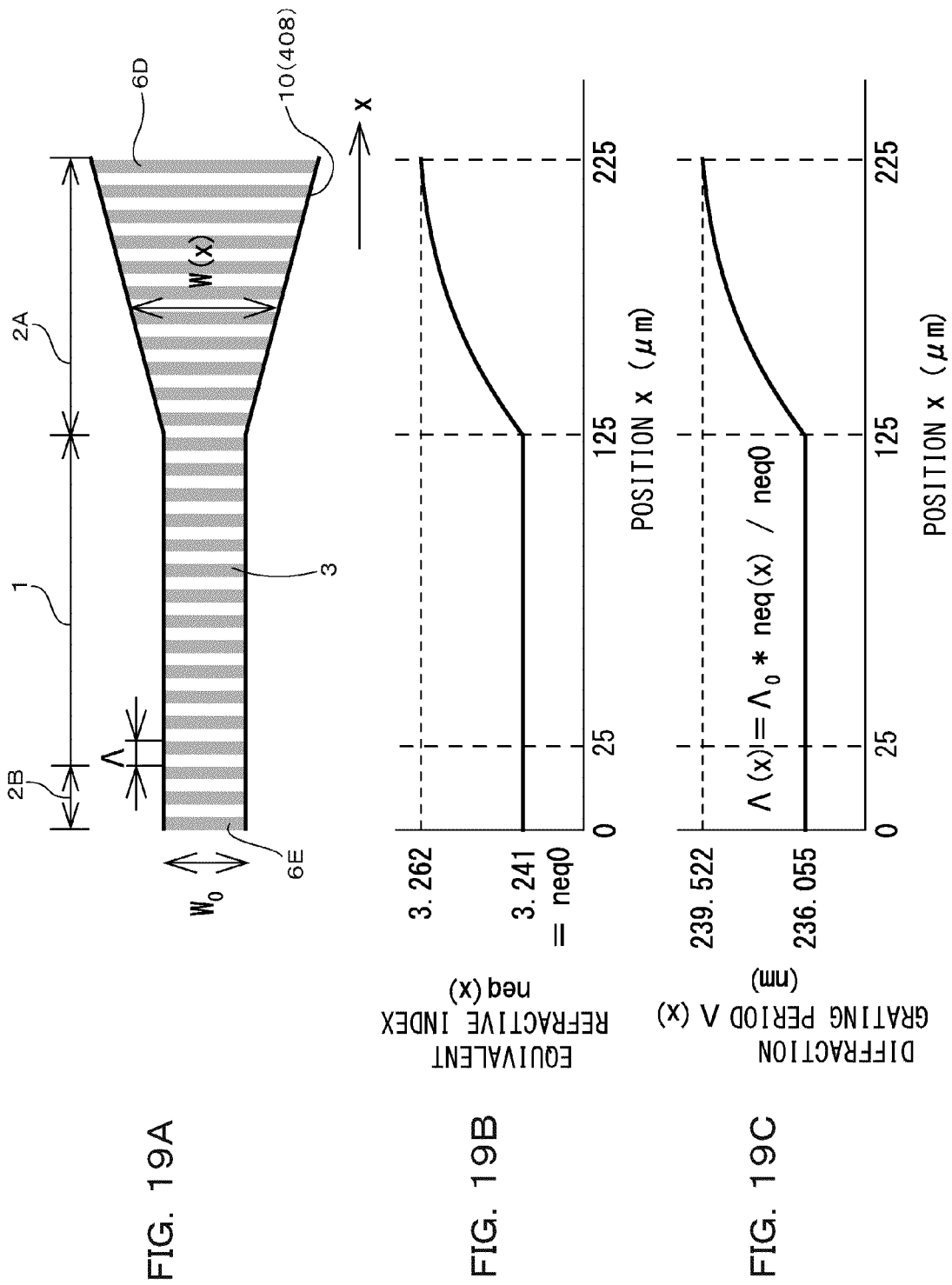

UPON NO-CURRENT INJECTION

CURRENT INJECTION START — THRESHOLD CURRENT INJECTION
REFRACTIVE INDEX DECREASE BY PLASMA EFFECT

REFLECTION SPECTRUM OF DISTRIBUTED REFLECTOR REGION
BRAGG MODE

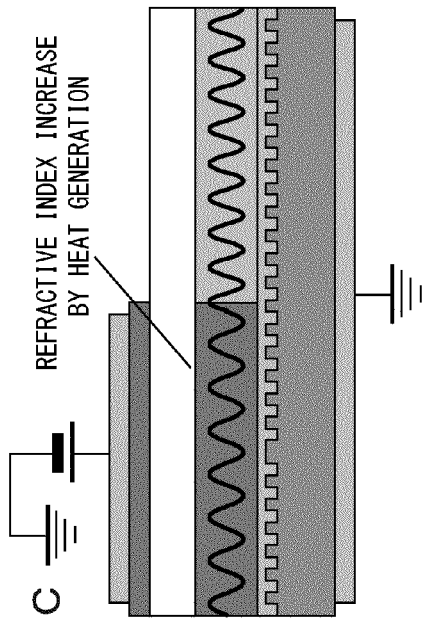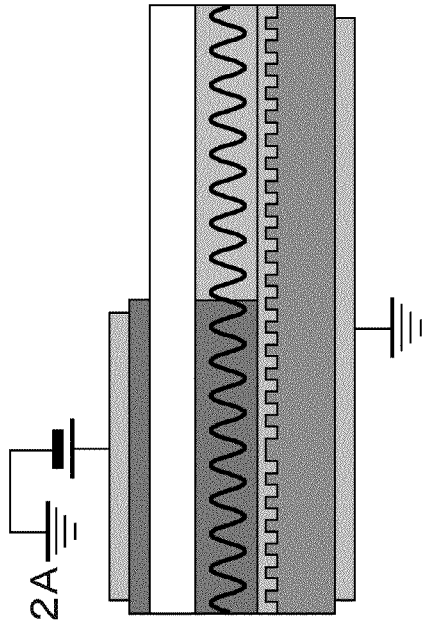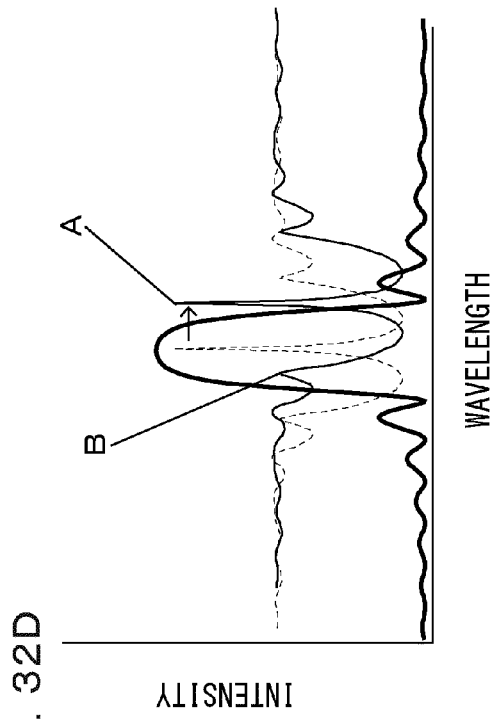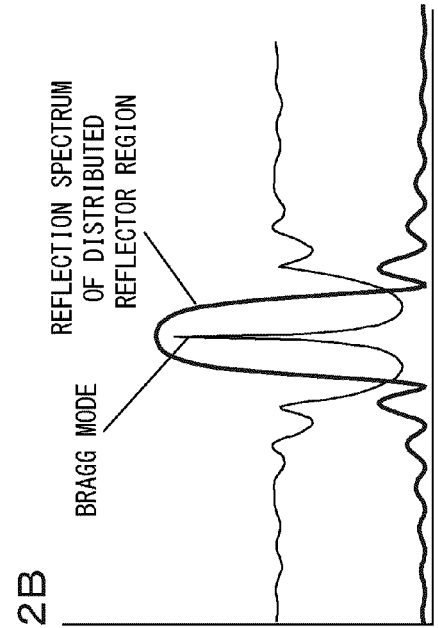
FIG. 32A THRESHOLD CURRENT INJECTION
FIG. 32C INJECTION CURRENT INCREASE
REFRACTIVE INDEX INCREASE BY HEAT GENERATION
FIG. 32B
REFLECTION SPECTRUM OF DISTRIBUTED REFLECTOR REGION
BRAGG MODE
FIG. 32D

SEMICONDUCTOR LASER

CROSS-REFERENCE TO RELATED APPLICATIONS

This application is based upon and claims the benefit of priority of the prior Japanese Patent Application No. 2009-101072, filed on Apr. 17, 2009, the entire contents of which are incorporated herein by reference.

FIELD

The embodiments discussed herein are related to a semiconductor laser.

BACKGROUND

Together with drastic increase of the Internet demand, grappling for achievement of a very high speed and a very great capacity is being actively carried out in optical communication/optical transmission.

Particularly, a semiconductor laser which can carry out direct modulation at 25 Gb/s or more is required for an ultra-high speed optical fiber transmission system for 40 Gb/s or more or for a data com such as, for example, the 100 Gb/s Ethernet (registered trademark) wherein four waves of 25 Gb/s are bundled by WDM (Wavelength Division Multiplexing).

As a semiconductor laser which can implement such high-speed direct modulation, a DFB (Distributed Feed-Back) laser is expected.

Basically, in a semiconductor laser, if the volume of an active layer is decreased as far as possible, then the value of the relaxation oscillation frequency increases, and the bit rate with which direct modulation can be carried out increases.

Actually, some DFB laser has implemented 40 Gb/s modulation at a room temperature by setting the length of a cavity of a DFB laser as short as 100 µm.

However, in such a DFB laser as described above, as illustrated in FIG. 28, an anti-reflection coating (reflection preventing film) is provided on a front end face and a high-reflection coating (high reflective film; reflectance of approximately 90%) is provided on a rear end face, and a diffraction grating which does not have a phase shift is provided along an active layer.

Therefore, the yield of devices with which single-longitudinal-mode oscillation is obtained depends much upon the phase of the diffraction grating on the rear end face. Then, the period of the diffraction grating is as fine as approximately 200 nm, and it is substantially impossible to precisely control the position of the end face upon cleavage into devices. Therefore, the phase on the rear end face is obliged to become random. Accordingly, the yield of devices with which good single-longitudinal-mode oscillation is obtained cannot be raised.

Further, a distributed reflector type (DR) laser, which achieves enhancement of the yield of devices with which single-longitudinal-mode oscillation is obtained and can carry out high-efficiency laser operation, is also available. Such a distributed reflector type laser as just described has, as a reflector on the rear end face thereof, not a high-reflection film but a diffraction grating having the same period as that of a diffraction grating in an active region and includes a passive region which functions as a passive reflector. Further, a phase shift is provided between the active region and the passive region. It is to be noted that the period of the diffraction grating in the passive region is fixed.

Also a distributed reflector type laser is available wherein, in order to raise the reflectance in the passive region, the depth of grooves of the diffraction grating in the passive region is set greater than that of grooves of the diffraction grating in the active region or the equivalent refractive index in the passive region is made different. It is to be noted that, also where the depth of grooves of the diffraction grating in the passive region is set greater than that of grooves of the diffraction grating in the active region, in the passive region, the period of the diffraction grating is fixed and also the depth of grooves of the diffraction grating is fixed. Moreover, where the equivalent refractive index in the passive region is made different with respect to the depth of grooves of the diffraction grating in the active region, in the passive region, the period of the diffraction grating is fixed and also the equivalent refractive index is fixed.

Furthermore, a distributed reflector type laser is available wherein a λ/4 phase shift is provided at the center of the active region and a passive region having a diffraction grating is provided as a reflector on the rear end face and besides the pitch of the diffraction grating is made different between the active region and the passive region in accordance with the difference in composition between the active region and the passive region. Consequently, the optical pitches of the diffraction gratings in the active region and the passive region are made equal to each other and the Bragg reflection wavelength in the passive region is made equal to the wavelength of laser light generated in the active region so that the laser light can be reflected effectively. It is to be noted that, although the pitch of the diffraction grating in the passive region is made different from the pitch of the diffraction grating in the active region, the pitch of the diffraction grating is fixed in the passive region. Also, the optical pitch of the diffraction grating in the passive region is fixed.

Furthermore, a distributed reflector type laser is available wherein, by providing a transition region in which the composition varies between the active region and the passive region such that the pitch of the diffraction grating is varied in conformity with the variation of the composition, the optical pitches (optical lengths of diffraction grating pitches) of the diffraction grating are made equal to each other between the active region and the transition region. It is to be noted that, while the pitch of the diffraction grating varies in the transition region, the optical pitch is fixed.

SUMMARY

According to an aspect of the embodiment, a semiconductor laser includes an active region including an active layer and a diffraction grating and a phase shift which determine an oscillation wavelength, and a distributed reflector region including a light guide layer and a reflection diffraction grating, and the distributed reflector region has an effective diffraction grating period which varies along a direction of a cavity.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 15A is a schematic top plan view illustrating a configuration of a waveguide portion of a semiconductor laser according to a third embodiment. FIG. 15B is a schematic view wherein part of FIG. 15A is enlarged and is a view illustrating a relationship among the period of a diffraction grating in a distributed reflector region, a tangential angle and an effective diffraction grating period. FIG. 15C is a view illustrating a variation of a tangential angle in a direction of a cavity of the semiconductor laser according to the third embodiment. FIG. 15D is a view illustrating a variation of an effective diffraction grating period in a direction of a cavity in the semiconductor laser according to the third embodiment.

FIG. 19A is a schematic view illustrating a configuration of a waveguide portion of a semiconductor laser according to a fourth embodiment. FIG. 19B is a view illustrating a variation of an equivalent refractive index in a direction of a cavity in the semiconductor laser according to the fourth embodiment. FIG. 19C is a view illustrating variation of an effective diffraction grating period in a direction of a cavity in the semiconductor laser according to the fourth embodiment.

FIGS. 32A to 32D are views illustrating a subject of the embodiments.

DESCRIPTION OF EMBODIMENTS

Figure 29:
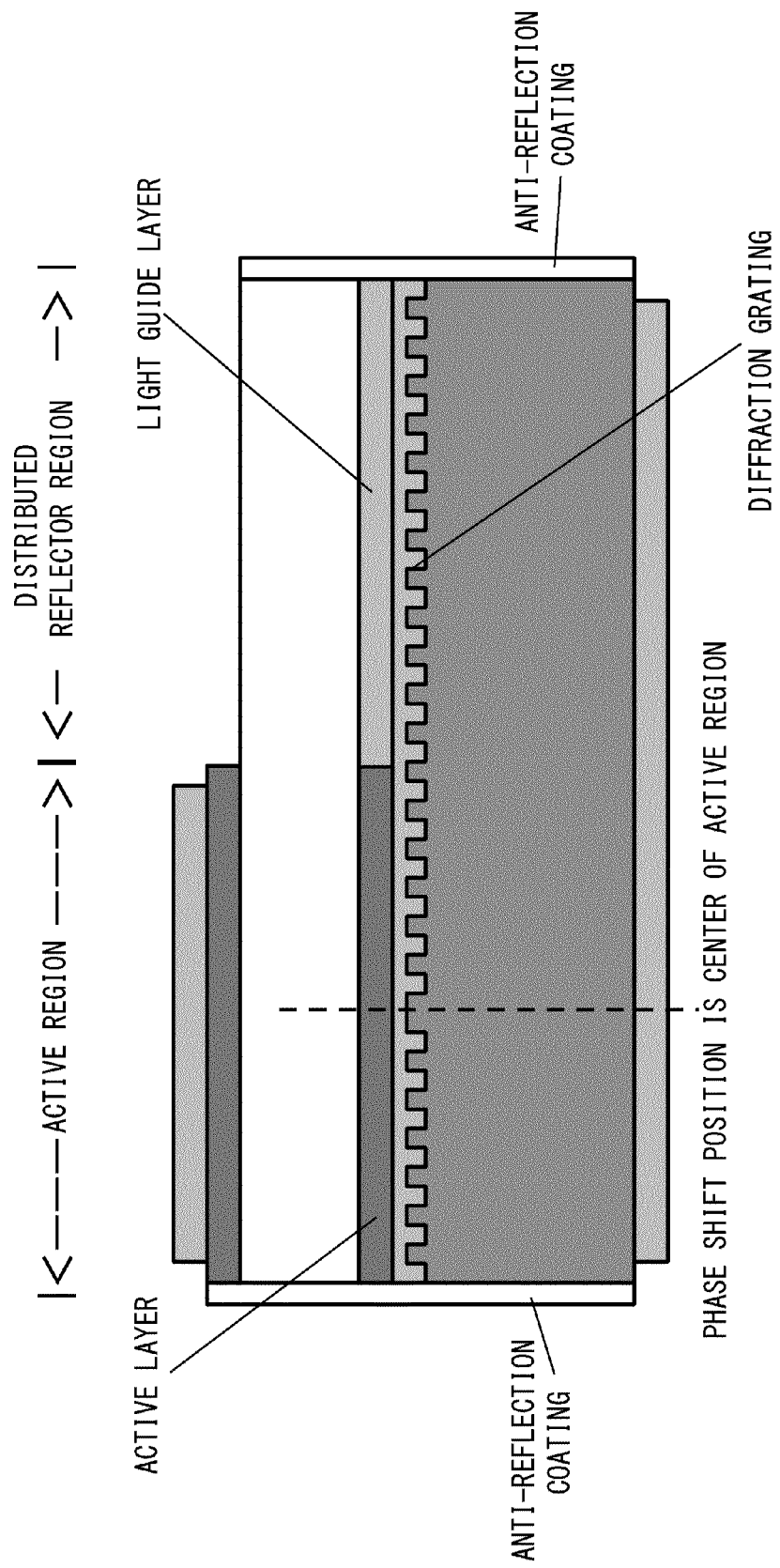
FIG. 29 is a schematic sectional view illustrating a configuration of a semiconductor laser produced in the process of origination of the embodiments.
Figure 30:
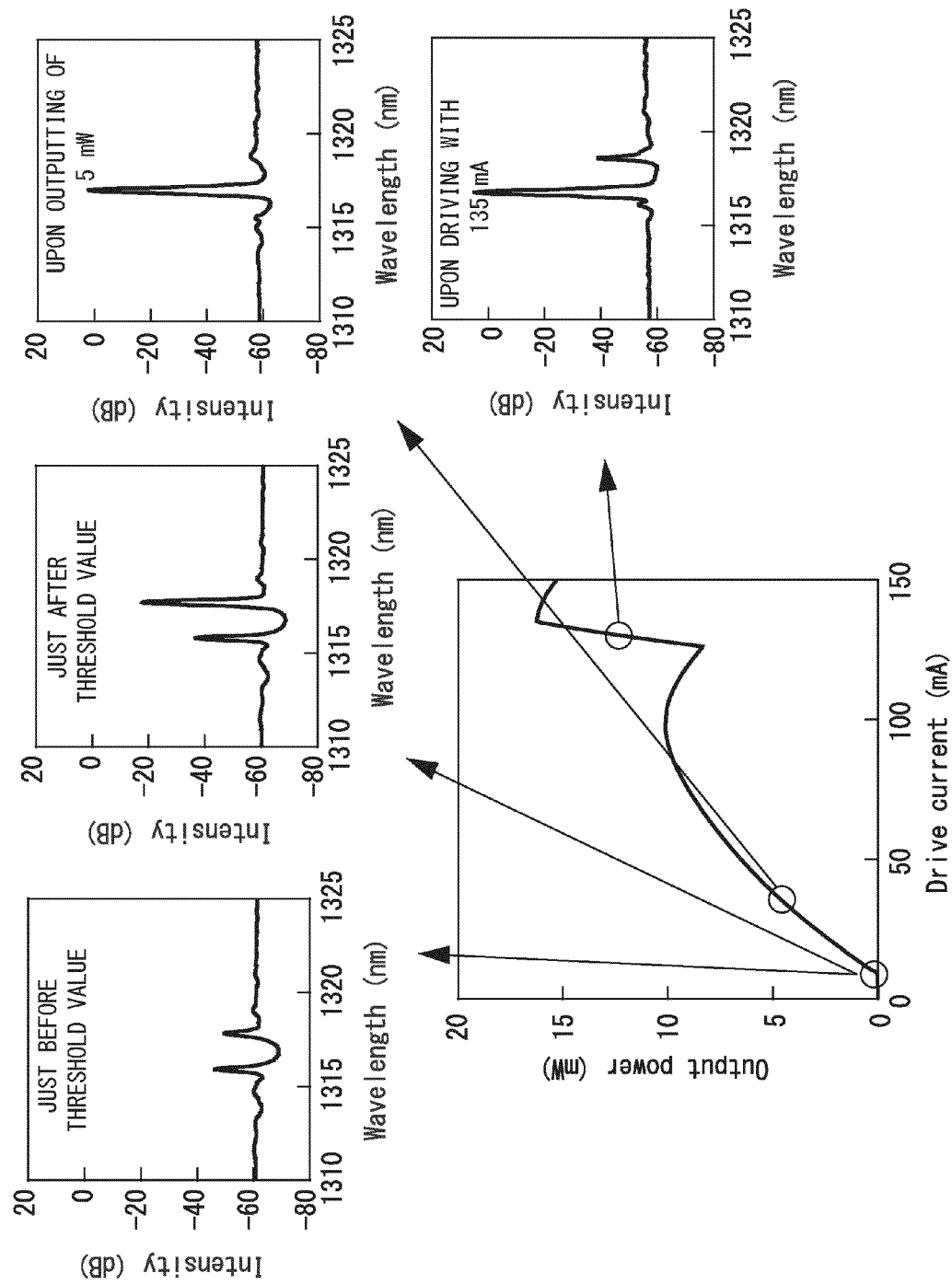
FIG. 30 is a view illustrating a subject of the embodiments.

Incidentally, when the inventors produced a distributed reflector type laser having such a structure as illustrated in FIG. 29, it was discovered that multi-mode oscillation or mode hopping appears around a threshold current or if driving current is gradually increased to increase the current injection amount as illustrated in FIG. 30.

When the cause of degradation of the yield of devices with which such single-longitudinal mode oscillation is obtained was investigated, it was found that mode hopping appearing around the threshold current, that is, within a range from the start of current injection to a point around the threshold current, arises from such a cause as described below.

Figure 31A:
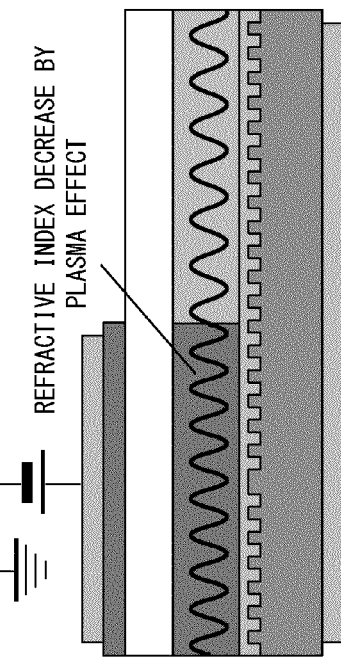
FIGS. 31A to 31D are views illustrating a subject of the embodiments.
Figure 31C:
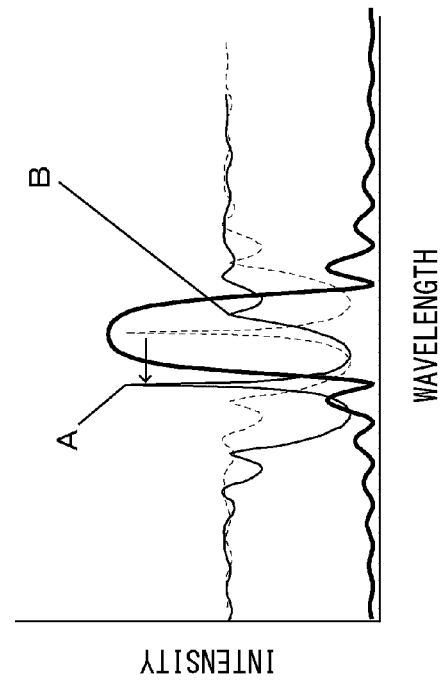
Figure 31B:
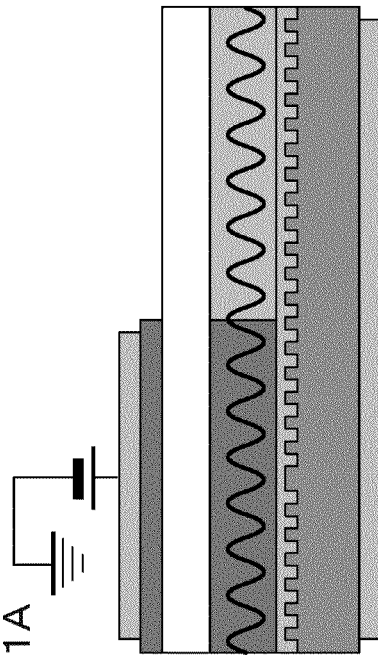

In particular, as illustrated in FIGS. 31A and 31B, a distributed reflector type laser is designed such that, upon no-current injection, a Bragg mode (Bragg wavelength) in an active region is placed substantially at the center of an effective reflection band of a distributed reflector region.

Figure 31D:
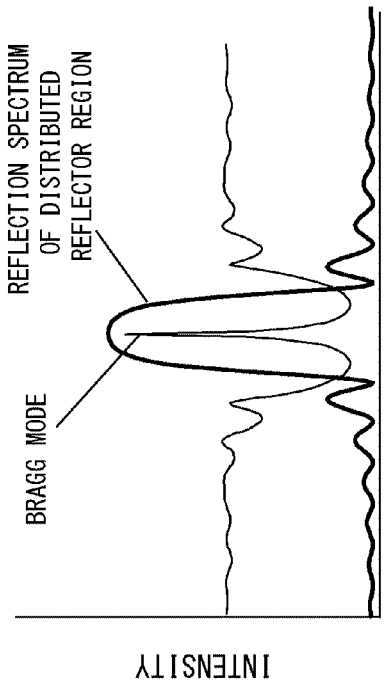

In this instance, since the refractive index in the active region is decreased by a plasma effect together with current injection to the active region from the start of current injection to a point around the threshold current as illustrated in FIG. 31C, the Bragg wavelength in the active region shifts to the short wavelength side as indicated by reference character A in FIG. 31D. On the other hand, since current is not injected to the distributed reflector region, the reflection wavelength band in the distributed reflector region does not vary. Therefore, as illustrated in FIG. 31D, the Bragg wavelength comes out of the effective reflection band of the distributed reflector. As a result, the threshold gain of the Bragg mode (main mode) increases and the mode [sub mode; indicated by reference character B in FIG. 31D] on the long wavelength side of a stop band in the active region enters the effective reflection band of the distributed reflector, and the threshold gain of the sub mode decreases. Consequently, it was found that multi-mode oscillation appears and the yield of devices with which single-longitudinal mode oscillation is obtained degrades.

On the other hand, it was found that mode hopping appearing where the current injection amount is increased gradually from the threshold current arises from such a cause as described below.

In particular, a distributed reflector type laser is designed such that the Bragg mode (Bragg wavelength) in the active region is placed substantially at the center of the effective reflection band in the distributed reflector region around the threshold current as illustrated in FIGS. 32A and 32B.

In this instance, since the temperature of the active region increases and the refractive index increases together with current injection to the active region as illustrated in FIG. 32C, the Bragg wavelength in the active region shifts to the long wavelength side as indicated by reference character A in FIG. 32D. On the other hand, since current is not injected into the distributed reflector region, the reflection wavelength band of the distributed reflector region does not vary. Therefore, the Bragg wavelength comes out of the effective reflection band of the distributed reflector as illustrated in FIG. 32D. As a result, the threshold gain of the Bragg mode (main mode) increases and the mode [sub mode; indicated by reference character B in FIG. 31D] on the short wavelength side of the stop band in the active region enters the effective reflection band of the distributed reflector, and the threshold gain of the sub mode decreases. Consequently, it was found that multi-mode oscillation appears and the yield of devices with which single-longitudinal mode oscillation is obtained degrades.

Therefore, it is desired that, in a semiconductor laser having a distributed reflector type laser structure, appearance of multi-mode oscillation or appearance of mode hopping is prevented around the threshold current or where driving current is gradually increased to increase the current injection amount, and the yield of devices with which single-longitudinal mode oscillation is obtained is enhanced.

In the following, semiconductor lasers according to the embodiments are described with reference to the drawings.

First Embodiment

First, a semiconductor laser according to a first embodiment is described with reference to FIGS. 1 to 10.

The semiconductor laser according to the present embodiment is a semiconductor laser as a light source, for example, for an optical fiber transmission system. Here, the present semiconductor laser is a distributed reflector type laser (DR laser; distributed reflector integrated distribution feedback type semiconductor laser) having a distributed reflector type laser structure.

As illustrated in FIG. 1A, the present distributed reflector type laser includes an active region 1 which functions as a distribution feedback type (DFB) laser region to which current is injected and laser oscillation occurs therein, and a distributed reflector region 2 to which no current is injected and which reflects laser light emitted from the active region 1 so as to return to the active region 1. It is to be noted that the active region 1 is hereinafter referred to sometimes as current injection region or distribution feedback active region. Further, the distributed reflector region 2 is also referred to as distributed Bragg reflection region, passive region or no-current injection region.

In the present distributed reflector type laser, since current injection is carried out only into the active region 1, a current injection electrode (p-side electrode) 115 is provided only in the active region 1. Further, an n-side electrode 116 is provided on the reverse face side of an n-type doped InP substrate 101. Further, in the present distributed reflector type laser, anti-reflection coatings (anti-reflection films) 117 and 118 are provided on both end faces.

Here, the active region 1 includes an active layer 105 which generates gain by current injection thereto, a diffraction grating 3 and a phase shift 4 which determine an oscillation wavelength, a p-type InP cladding layer 110 and a p-type GaInAs contact layer 111. Here, the phase shift 4 is a $\lambda/4$ phase shift and the phase shift amount of the phase shift 4 is a value in the proximity of $\lambda/4$. In short, the active region 1 includes an active waveguide on which the diffraction grating 3 having the phase shift 4 is provided.

In the present embodiment, the active region 1 includes a diffraction grating layer 5 including the diffraction grating 3 which includes the phase shift 4 and an n-type doped GaInAsP layer 103, and an undoped AlGaInAs/AlGaInAs quantum well active layer 105 as a waveguide core layer.

Here, the diffraction grating layer 5 is formed by burying the diffraction grating 3 including the phase shift 4 formed on the surface of the n-type doped InP substrate 101 with the n-type doped GaInAsP layer 103. Further, the n-type doped GaInAsP layer 103 has a compositional wavelength of approximately 1.20 μm and a thickness of approximately 120 nm. Meanwhile, the undoped AlGaInAs/AlGaInAs quantum well active layer 105 has a compositional wavelength of approximately 1,310 nm.

Figure 9A:
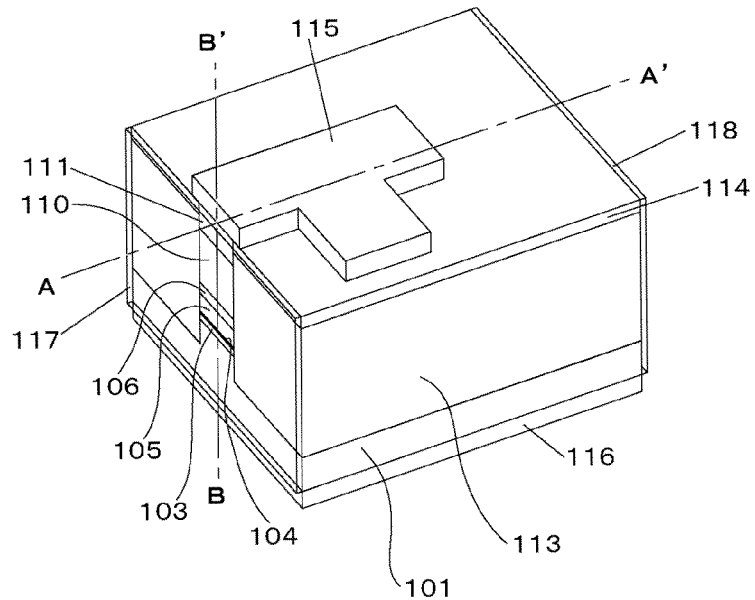
FIG. 9A is a schematic perspective view illustrating the fabrication method of the semiconductor laser according to the first embodiment and FIG. 9B is a schematic sectional view illustrating a concrete example of a configuration of the semiconductor laser.
Figures 9B, 9C:
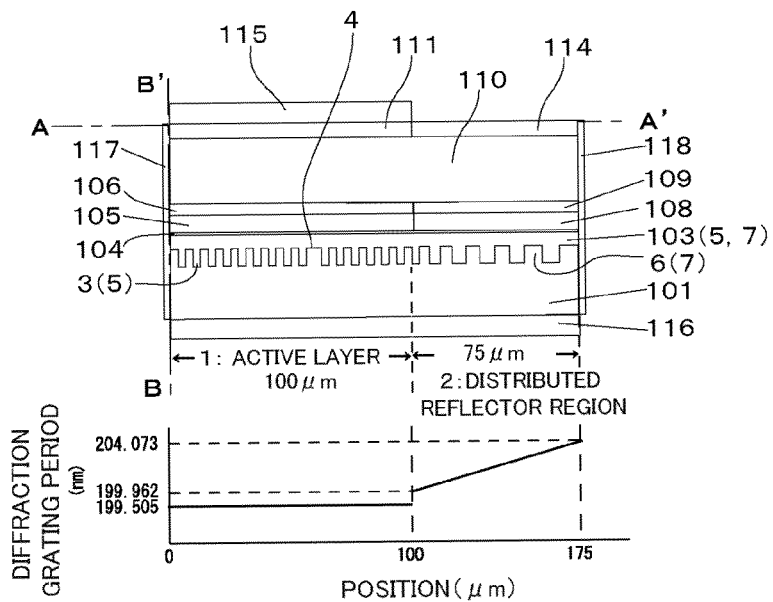
FIG. 9C is a view illustrating a variation of a diffraction grating period in the direction of the cavity of the semiconductor laser.

Here, as illustrated in FIGS. 9B and 9C, the length of the active region 1 is approximately 100 μm. Further, the period of the diffraction grating 3 in the active region 1 is fixed to approximately 199.505 nm. Further, in the active region 1, the coupling coefficient (duty ratio and depth) and the phase (other than that at the location of the phase shift 4) of the diffraction grating 3 are fixed. Further, in the active region 1, the equivalent refractive index of the waveguide (active layer 6) is fixed along a direction of a cavity. Further, the $\lambda/4$ phase shift 4 whose phase is shifted by $\pi$ radians (corresponding to a $\lambda/4$ shift) is provided on the rear end face side by approximately 15 μm with respect to the center of the active region 1 (refer to FIG. 6A).

As illustrated in FIG. 1A, the distributed reflector region 2 includes a light guide layer (passive waveguide core layer) 108 which generates no gain, a reflection diffraction grating 6, and a p-type InP cladding layer 110. In short, the distributed reflector region 2 includes a passive waveguide on which the reflection diffraction grating 6 is provided. The light guide layer 108 has an approximately 1.15 μm composition in order to prevent occurrence of absorption loss. It is to be noted that, in FIG. 1A, reference numeral 114 denotes a $SiO_2$ passivation film.

In the present embodiment, the distributed reflector region 2 includes a reflection diffraction grating layer 7 including the reflection diffraction grating 6 and the n-type doped GaInAsP layer 103, and the undoped AlGaInAs light guide layer 108 as a waveguide core layer.

Here, the reflection diffraction grating layer 7 is formed by burying the reflection diffraction grating 6 formed on the surface of the n-type doped InP substrate 101 with the n-type doped GaInAsP layer 103. Further, the n-type doped GaInAsP layer 103 has a compositional wavelength of approximately 1.20 μm and a thickness of approximately 120 nm. Further, the undoped AlGaInAs light guide layer 108 has a compositional wavelength of approximately 1.15 μm and a thickness of approximately 250 nm.

Here, the distributed reflector region 2 is provided so as to continue to the rear end face side (right side in FIG. 1A) in the active region 1. In the present embodiment, as illustrated in FIG. 9B, the distributed reflector region 2 having a length of approximately 75 μm is provided continuing to the active region 1. In particular, the reflection diffraction grating 6 is patterned over the length of approximately 75 μm continuing to the active region 1. Here, the phase of the diffraction grating 3 in the active region 1 and the phase of the reflection diffraction grating 6 in the distributed reflector region 2 are same as each other.

Particularly, in the present embodiment, the effective diffraction grating period of the distributed reflector region 2 varies along the direction of the cavity.

Here, as illustrated in FIGS. 1A and 1B, the period of the reflection diffraction grating 6 varies along the direction of the cavity (lengthwise direction of the cavity; direction along the optical waveguide). In particular, a chirp diffraction grating is used as the reflection diffraction grating 6.

Further, in the present embodiment, the effective diffraction grating period of the distributed reflector region 2 increases as the distance from the active region 1 increases. Further, the effective diffraction grating period of the distributed reflector region 2 is longer than the period of the diffraction grating 3 in the active region 1 at the position which the distributed reflector region 2 contacts with the active region 1. Such a configuration as described above is suitable for a laser whose threshold current is low, that is, a laser wherein the shift of the Bragg wavelength to the short wavelength side (temperature drift by a plasma effect) is small.

In particular, the period of the reflection diffraction grating 6 increases as the distance from the active region 1 increases. Here, as illustrated in FIG. 9C, the period of the reflection diffraction grating 6 varies linearly such that it is approximately 199.962 nm on the interface with the active region 1 and is approximately 204.073 nm on the rear end face. It is to be noted that FIG. 9C indicates the value of the diffraction grating period along the direction of the cavity.

Further, at the position at which the active region 1 and the distributed reflector region 2 contact with each other, the period of the diffraction grating 3 in the active region 1 is approximately 199.505 nm and the period of the reflection diffraction grating 6 is approximately 199.962 nm. Thus, the period of the reflection diffraction grating 6 is longer than the period of the diffraction grating 3 in the active region 1.

Figure 8A:
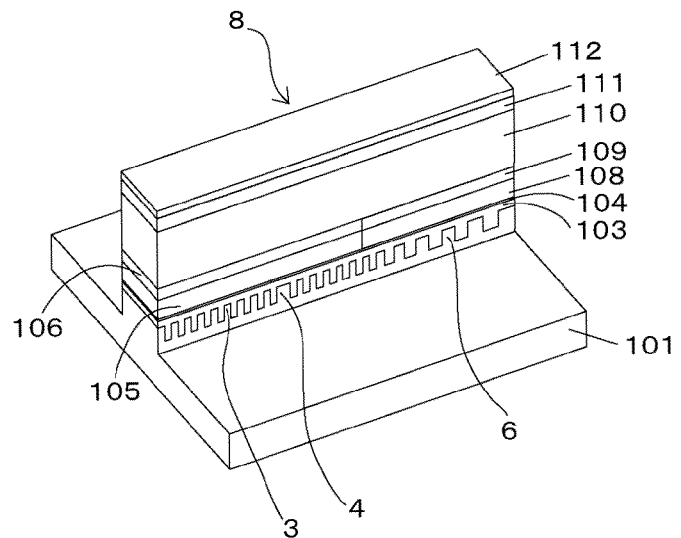
FIGS. 8A and 8B are schematic perspective views illustrating the fabrication method of the semiconductor laser according to the first embodiment.

It is to be noted that the distributed reflector region 2 extends linearly along the direction of the cavity (refer to FIG. 8A). Further, in the distributed reflector region 2, the equivalent refractive index of the waveguide (light guide layer) is fixed along the direction of the cavity. Further, in the distributed reflector region 2, the coupling coefficient (duty ratio and depth) and the phase of the reflection diffraction grating 6 are fixed.

Figure 1:
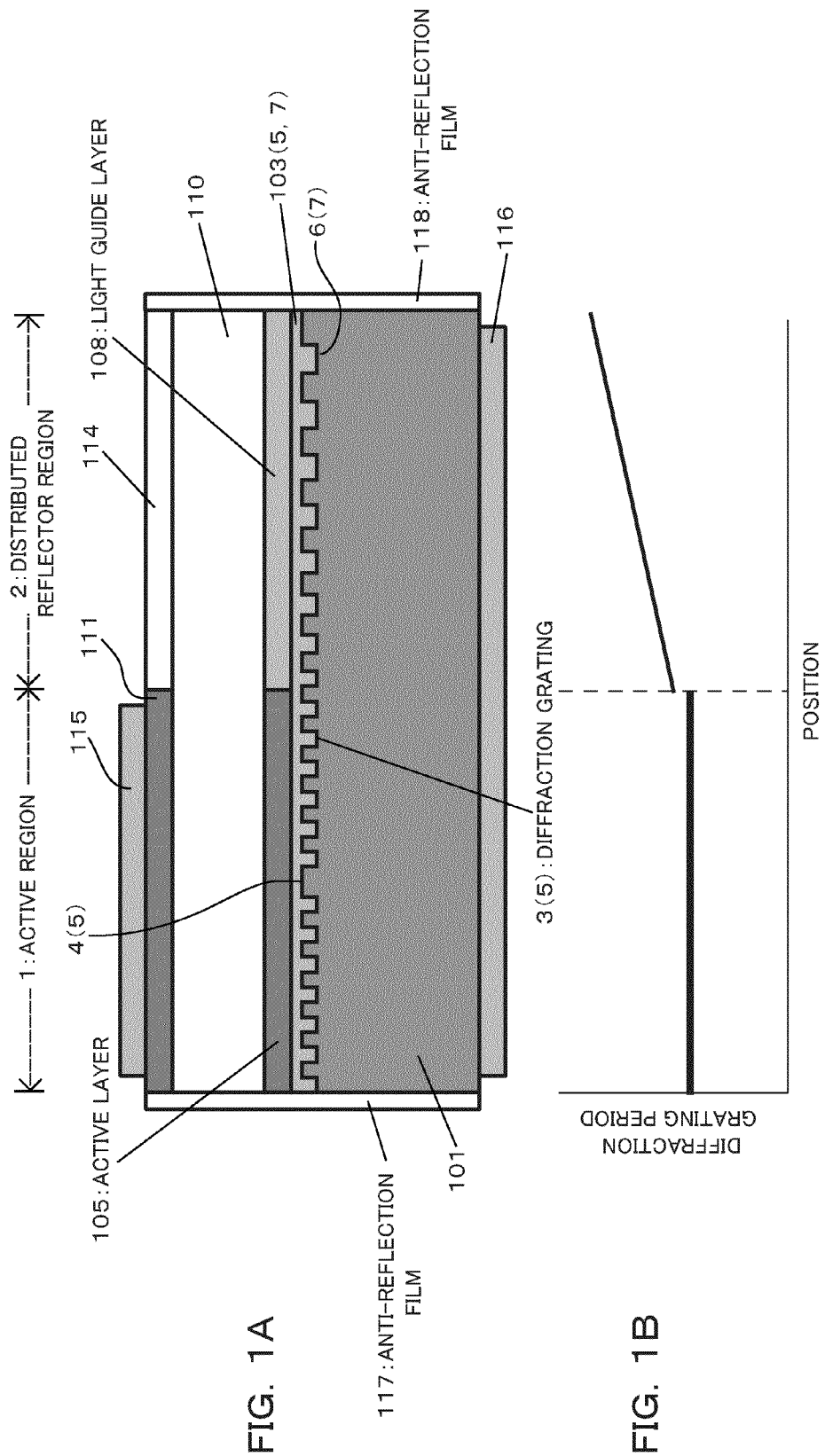
FIG. 1A is a schematic sectional view illustrating a configuration of a semiconductor laser according to a first embodiment.
FIG. 1B is a view illustrating a variation of a diffraction grating period in a direction of a cavity in the semiconductor laser according to the first embodiment.

Further, the coupling coefficient of the diffraction grating 3 in the active region 1 and the coupling coefficient of the reflection diffraction grating 6 in the distributed reflector region 2 are equal to each other. In particular, as illustrated in FIG. 1, the depth of the diffraction grating 3 in the active region 1 and the depth of the reflection diffraction grating 6 in the distributed reflector region 2 are equal to each other. Here, both of the depths of the diffraction grating 3 in the active region 1 and the reflection diffraction grating 6 in the distributed reflector region 2 are approximately 100 nm. Further, the duty ratio (ratio of a portion remaining through etching with respect to the period of the diffraction grating; here approximately 50%) of the diffraction grating 3 in the active region 1 and the duty ratio of the reflection diffraction grating 6 in the distributed reflector region 2 are also equal to each other.

The reason why such a configuration as described above is applied is that it is intended to enhance the yield of devices with which single-longitudinal mode oscillation is obtained.

In particular, even if the refractive index in the active region 1 decreases together with current injection to the active region 1 and consequently the Bragg wavelength in the active region 1 shifts to the short wavelength side, it is necessary to prevent the threshold gain of a mode (sub mode) on the long wavelength side of a stop band of the active region 1 from decreasing and causing oscillation.

Further, even if the temperature of the active region 1 increases together with current injection to the active region 1, the refractive index of the active region 1 increases and consequently the Bragg wavelength of the active region 1 shifts to the long wavelength side, it is necessary to prevent the threshold gain of a mode (sub mode) on the short wavelength side of the stop band of the active region 1 from decreasing and causing oscillation.

Figure 2:
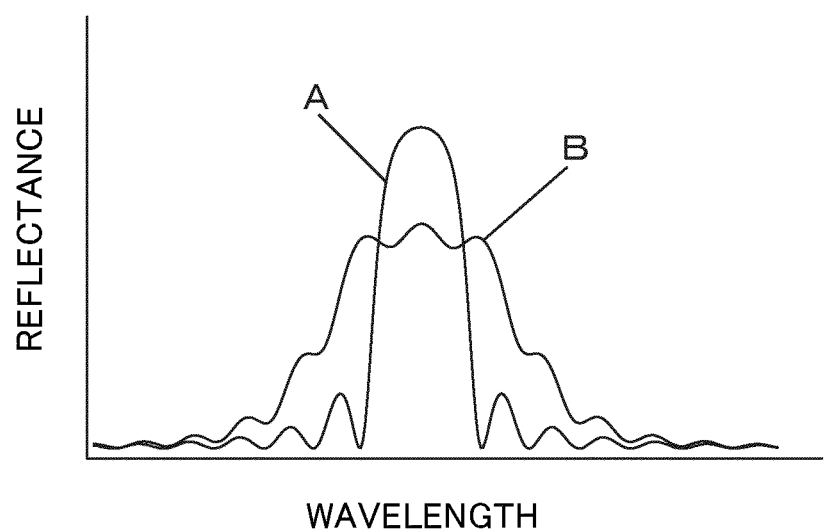
FIG. 2 is a schematic view illustrating a reflection wavelength band of a distributed reflector region of the semiconductor laser according to the first embodiment.
Figure 3A:
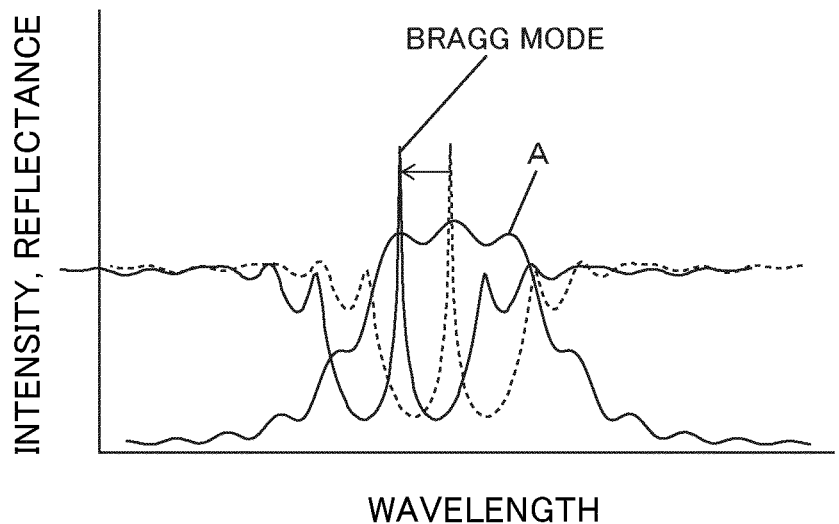
FIGS. 3A and 3B are views illustrating action of the semiconductor laser according to the first embodiment.
Figure 3B:
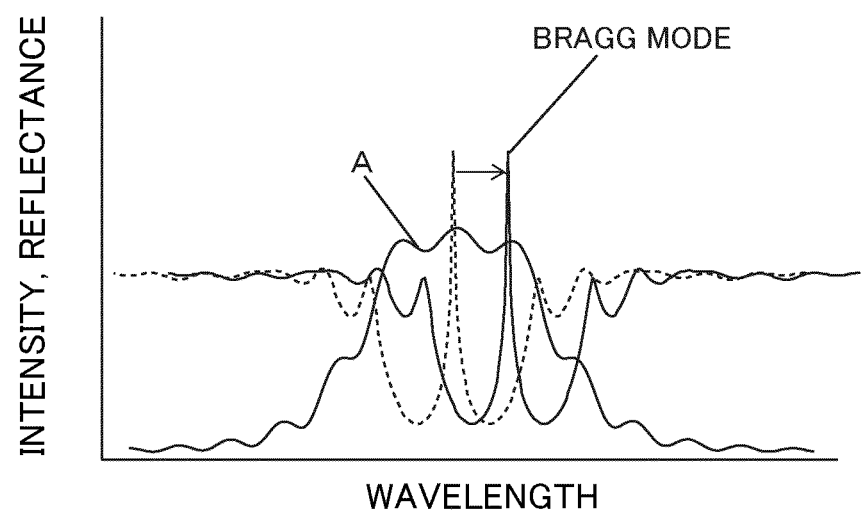

Therefore, in the present embodiment, the period of the reflection diffraction grating 6 is varied along the direction of the cavity as illustrated in FIG. 1. In this manner, the reflection wavelength band (effective reflection band of a distributed reflector) of the distributed reflector region 2 is expanded as indicated by a solid line B in FIG. 2 with respect to the reflection wavelength band in a case wherein a diffraction grating having a fixed period is provided as indicated by a solid line A in FIG. 2. As a result, even if the Bragg wavelength (Bragg mode) of the active region 1 shifts to the short wavelength side as illustrated in FIG. 3A or shifts to the long wavelength side as illustrated in FIG. 3B, the Bragg wavelength does not come out of an effective reflection band (indicated by a solid line A in FIGS. 3A and 3B) of the distributed reflector. Consequently, multi-mode oscillation or mode hopping can be suppressed and good single-longitudinal mode oscillation can be maintained. Further, in this instance, if only the period of the reflection diffraction grating 6 is varied, the effective reflection band of the distributed reflector region 2 can be expanded without drastic decrease of the reflectance as illustrated in FIGS. 2, 3A, and 3B.

Particularly, the Bragg wavelength in the active region 1 shifts by a greater amount to the long wavelength side. Therefore, in the present embodiment, the period of the reflection diffraction grating 6 increases as the distance from the active region 1 increases so that the reflection wavelength band of the distributed reflector region 2 is expanded by a greater amount on the long wavelength side.

Figure 4A:
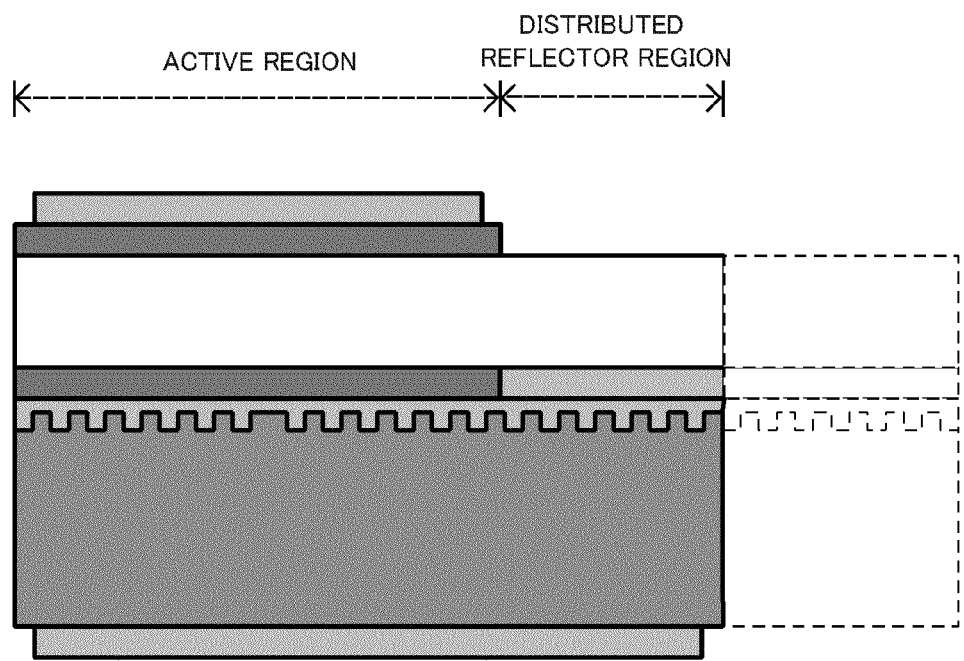
FIGS. 4A and 4B are views for describing a subject of the embodiments.
Figure 4B:
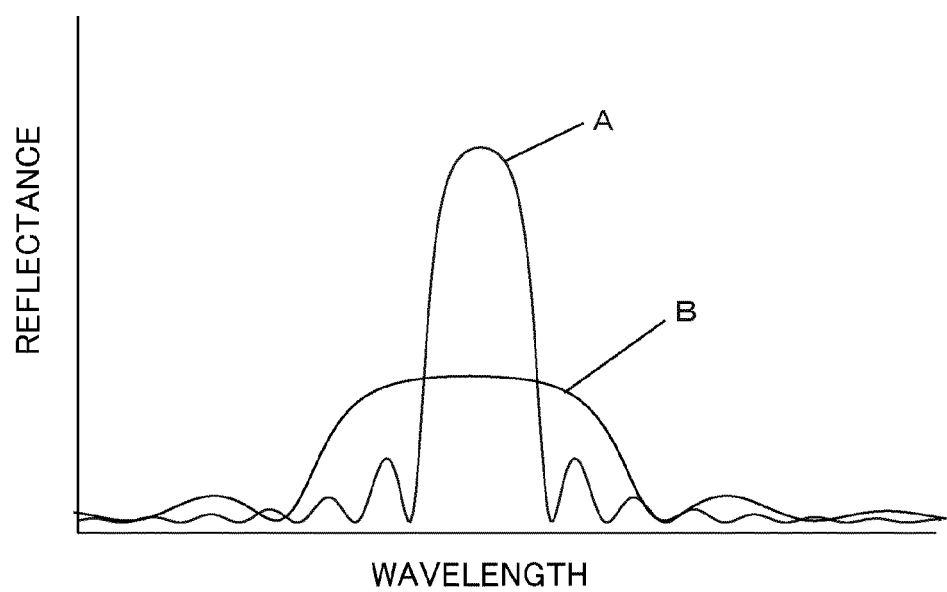
Figure 5:
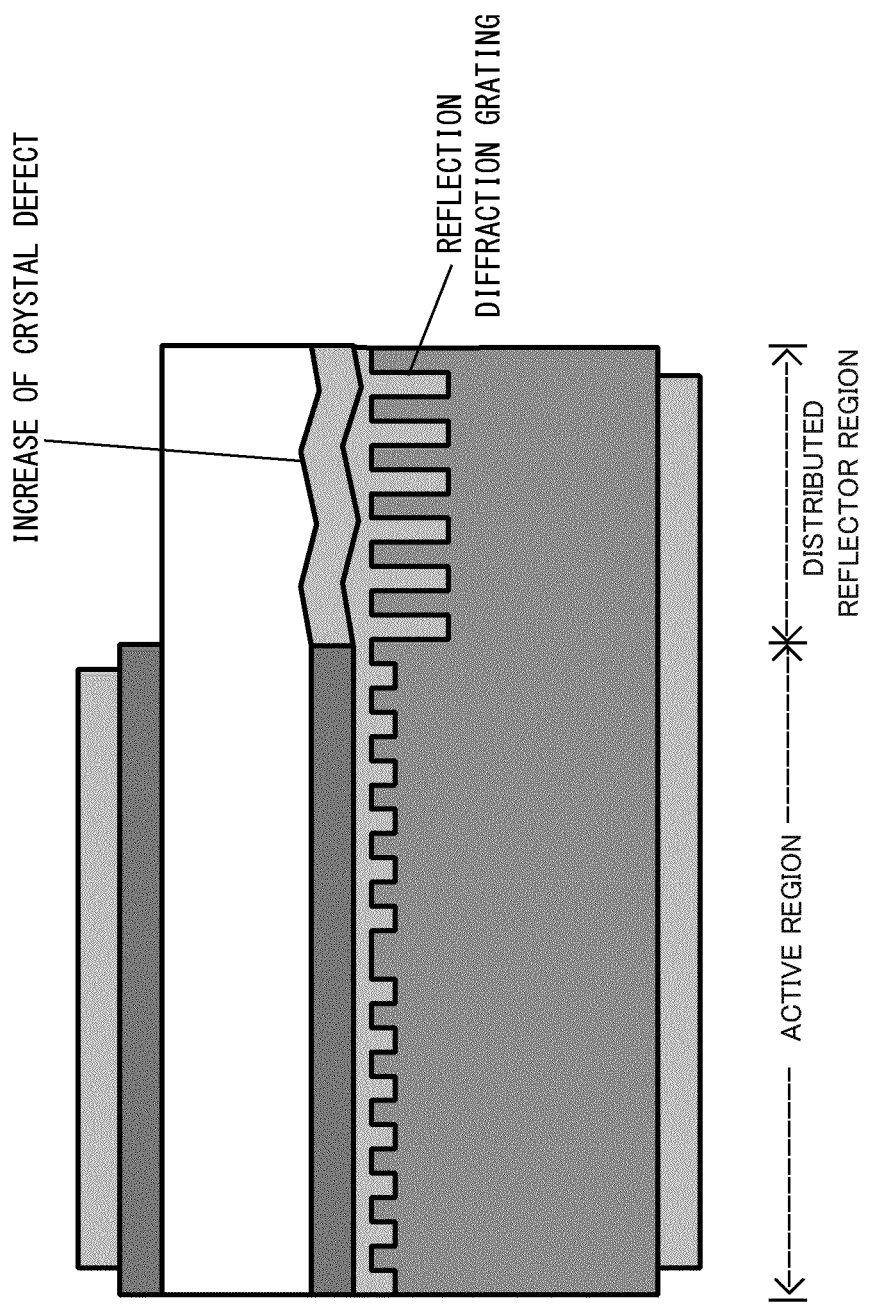
FIG. 5 is a schematic sectional view for describing another subject of the embodiments.

It is to be noted that, for example, the reflection wavelength band of the distributed reflector region has a substantially inverse proportional relationship with the length of the distributed reflector region. Therefore, it seems a possible idea that, as illustrated in FIG. 4A, the period of the reflection diffraction grating in the distributed reflector region is set fixed and the length of the distributed reflector region is set small (here, set to one half length). Consequently, the reflection wavelength band of the distributed reflector region can be expanded as indicated by a solid line B in FIG. 4B with respect to the reflection wavelength band of the distributed reflector region of the original length (indicated by a broken line in FIG. 4A) indicated by a solid line A in FIG. 4B. However, if the length of the distributed reflector region is set short, for example, to one half length, as illustrated in FIG. 4A, then, since the reflectance decreases to one half or less as indicated by a solid line B in FIG. 4B, the threshold current of the laser increases. Therefore, in order to compensate for this, for example, it seems a possible idea that, the depth of the reflection diffraction grating is set substantially to a double (for example, to approximately 200 nm or more) so that the coupling coefficient of the reflection diffraction grating in the distributed reflector region is increased substantially to a double, for example, as illustrated in FIG. 5. However, in this instance, since a great number of faults arise upon crystal growth, the device characteristic degrades.

Now, a fabrication method of a semiconductor laser (DR laser) according to a particular example of the configuration of the present embodiment is described with reference to FIGS. 6A to 9C.

Figure 6A:
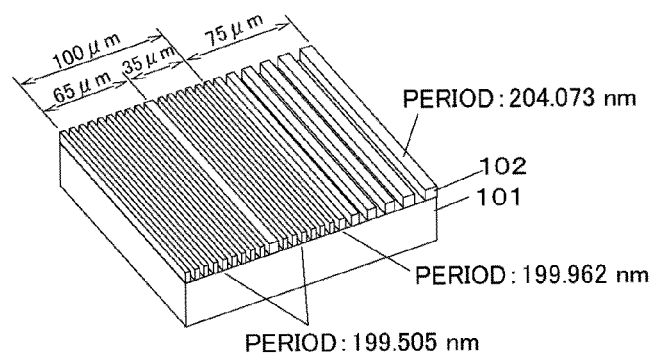
FIGS. 6A to 6D are schematic perspective views illustrating a fabrication method of the semiconductor laser according to the first embodiment.

First, as illustrated in FIG. 6A, a mask 102 made from an electron beam resist (ZEP 520, a product of Japan Zeon) and having a diffraction grating pattern is formed, for example, by an electron beam exposure method on the surface of an n-type doped InP substrate 101. It is to be noted that the diffraction grating pattern includes a diffraction grating pattern for forming the diffraction grating 3 (including the phase shift 4) in the active region 1 and a reflection diffraction grating pattern for forming the reflection diffraction grating 6 in the distributed reflector region 2.

Figure 6B:
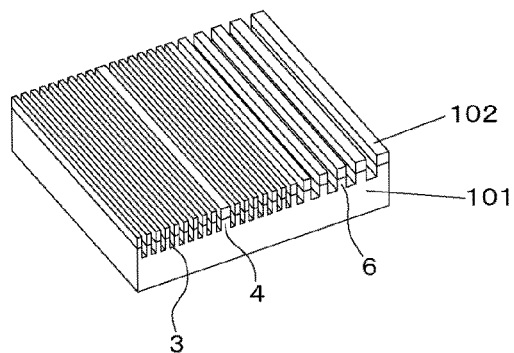

Then, with using the mask 102, part of the surface of the n-type InP substrate 101 is removed, for example, by reactive ion etching (RIE) with ethane/hydrogen mixture gas, to transfer the diffraction grating pattern as illustrated in FIG. 6B. Here, the etching is stopped halfway of the n-type InP substrate 101.

Consequently, the diffraction grating 3 (including the phase shift 4) in the active region 1 and the reflection diffraction grating 6 in the distributed reflector region 2 are formed collectively. In particular, the diffraction grating 3 having the λ/4 phase shift 4 whose phase is shifted by π radians (corresponding to a λ/4 shift) is formed on the rear end face side by approximately 15 μm with respect to the center of the active region over the overall length (here, approximately 100 μm) of a region which later becomes the active region 1 of individual devices (refer to FIG. 6A). Further, the reflection diffraction grating 6 is formed over the overall length (here, approximately 75 μm) of a region which later becomes the distributed reflector region 2 continuing from the diffraction grating 3 in the active region 1 (refer to FIG. 6A).

In the present embodiment, the period of the diffraction grating 3 to be formed in the region which later becomes the active region 1 is fixed to approximately 199.505 nm (refer to FIG. 6A). Further, the coupling coefficient and the phase of the diffraction grating 3 are fixed in the active region 1. Furthermore, the equivalent refractive index of the waveguide is fixed along the direction of the cavity in the active region 1.

Further, the period of the reflection diffraction grating 6 formed in a region which later becomes the distributed reflector region 2 is approximately 199.962 nm on the interface with the active region 1 and is approximately 204.073 nm on the rear end face (refer to FIG. 6A), and the period varies linearly (refer to FIG. 1B). Here, the period of the reflection diffraction grating 6 in the distributed reflector region 2 is longer than the period of the diffraction grating 3 in the active region 1 at the position which the distributed reflector region 2 contacts with the active region 1. Further, the coupling coefficient and the phase of the reflection diffraction grating 6 are fixed in the distributed reflector region 2.

Further, both of the depths of the diffraction grating 3 in the active region 1 and the reflection diffraction grating 6 in the distributed reflector region 2 are approximately 100 nm and are equal to each other. Further, the duty ratios (here, approximately 50%) of the diffraction grating 3 in the active region 1 and the reflection diffraction grating 6 in the distributed reflector region 2 are also equal to each other. In short, the coupling coefficients of the diffraction grating 3 in the active region 1 and the reflection diffraction grating 6 in the distributed reflector region 2 are equal to each other. Further, the phases of the diffraction grating 3 in the active region 1 and the reflection diffraction grating 6 in the distributed reflector region 2 are also same as each other.

Figure 6C:
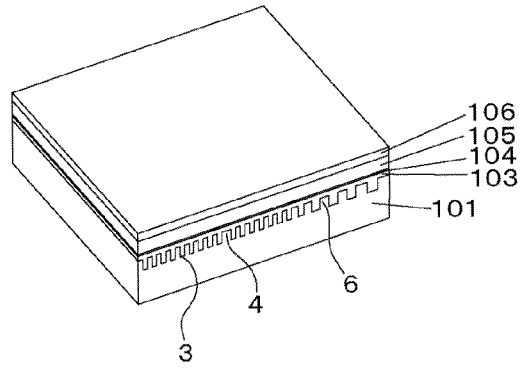

Then, as illustrated in FIG. 6C, the mask 102 is removed from the surface using a normal resist removing process. Thereafter, the n-type doped GaInAsP layer (guide layer) 103 is grown on the surface of the n-type InP substrate 101 on which the diffraction grating pattern is formed, for example, by using a metal organic chemical vapor deposition (MOVPE) method. Here, the n-type doped GaInAsP layer 103 has a compositional wavelength of approximately 1.20 μm and a thickness of approximately 120 nm. Consequently, the grooves (diffraction grating pattern) formed by stopping the etching halfway of the n-type InP substrate 101 are buried in the n-type doped GaInAsP layer 103.

Then, as illustrated in FIG. 6C, an n-type doped InP layer 104, an undoped AlGaInAs/AlGaInAs quantum well active layer 105 and a p-type doped InP cladding layer 106 are grown in order on the n-type doped GaInAsP layer 103, for example, by a MOVPE method. Here, the thickness of the n-type doped InP layer 104 is approximately 20 nm. Meanwhile, the thickness of the p-type doped InP cladding layer 106 is approximately 250 nm.

Here, the quantum well active layer 105 is configured using an AlGaInAs type compound semiconductor material. In particular, the quantum well active layer 105 is configured from an undoped AlGaInAs well layer and an undoped AlGaInAs barrier layer. Here, the undoped AlGaInAs well layer has a thickness of approximately 6 nm and a compression strain amount of approximately 1.2%. Further, the undoped AlGaInAs barrier layer has a compositional wavelength of approximately 1.05 μm and a thickness of approximately 10 nm. Further, a stack number of the quantum well active layer 105 is 15 layers and the light emission wavelength (oscillation wavelength) of the quantum well active layer 105 is approximately 1,310 nm.

It is to be noted that undoped AlGaInAs-SCH (Separate Confinement Heterostructure) layers may be provided above and below the quantum well active layer 105 so as to sandwich the quantum well active layer 105. Here, the undoped AlGaInAs-SCH layers (light guide layers) individually have a compositional wavelength of approximately 1.05 μm and a thickness of approximately 20 nm.

Figure 6D:
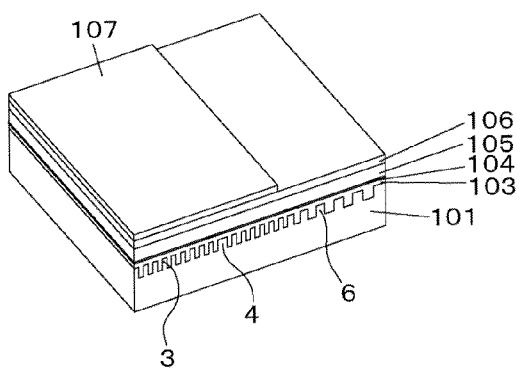

Then, as illustrated in FIG. 6D, a striped SiO$_2$ mask (etching mask) 107 is formed on the surface of the p-type doped InP cladding layer 106 using a normal chemical vapor deposition (CVD) method and a photolithography technique so as to cover the region which later becomes the active region 1. Here, the thickness of the SiO$_2$ mask 107 is approximately 400 nm.

Figure 7A:
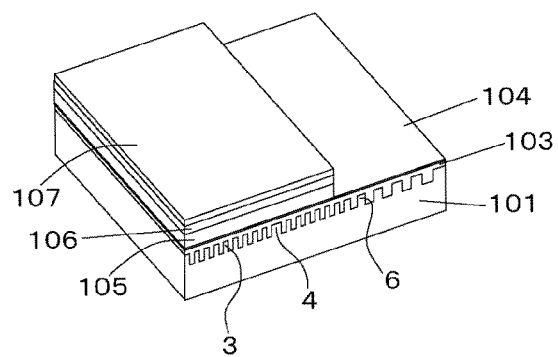
FIGS. 7A to 7D are schematic perspective views illustrating the fabrication method of the semiconductor laser according to the first embodiment.

Then, as illustrated in FIG. 7A, the p-type doped InP cladding layer 106 and the quantum well active layer 105, that is, from the surface of the p-type doped InP cladding layer 106 to the surface of the n-type doped InP layer 104 are removed using the mask 107, for example, by etching.

Figure 7B:
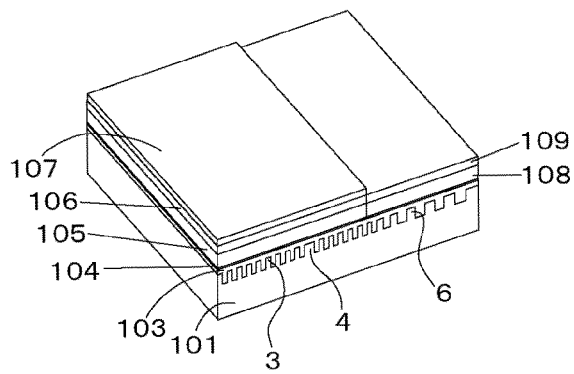

Thereafter, as illustrated in FIG. 7B, an undoped AlGaInAs layer 108 and an undoped InP layer 109 are grown in order on the n-type doped InP layer 104, for example, by a MOVPE method. Here, the undoped AlGaInAs layer 108 has a compositional wavelength of approximately 1.15 μm and a thickness of approximately 250 nm. Further, the thickness of the undoped InP layer 109 is approximately 250 nm. At this time, by selective growth, the layers 108 and 109 do not grow on the SiO$_2$ mask 107 but grow only on the n-type doped InP layer 104 exposed on the surface.

Figure 7C:
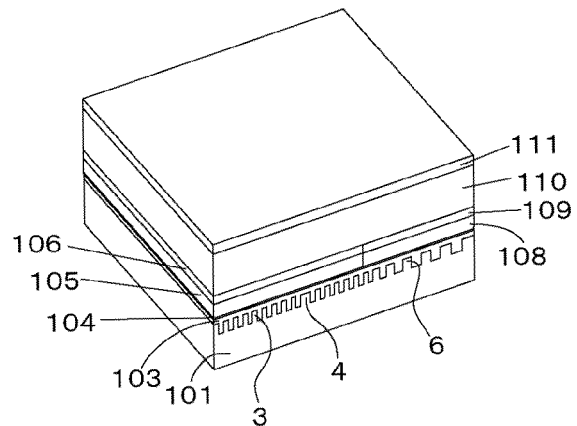

Thereafter, the SiO$_2$ mask 107 is removed, and then, for example, a p-type InP cladding layer 110 and a p-type GaInAs contact layer 111 are stacked in order on the overall face of the semiconductor crystal wafer as illustrated in FIG. 7C using the MOVPE method again. Here, the p-type InP cladding layer 110 is formed by doping Zn therein and has a thickness of approximately 2.5 μm. Further, the p-type GaInAs contact layer 111 is formed by doping Zn therein and has a thickness of approximately 300 nm.

Figure 7D:
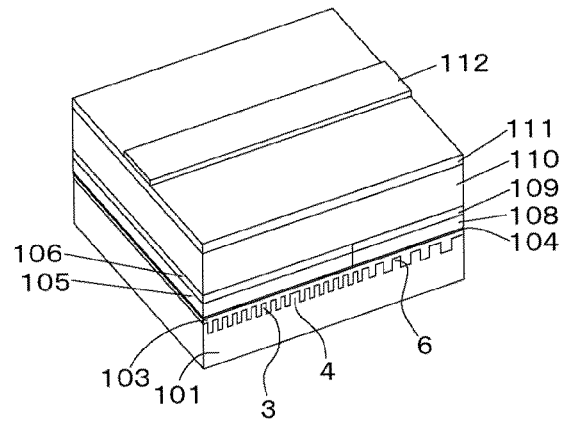

Then, as illustrated in FIG. 7D, a SiO$_2$ mask 112 is formed on the surface of the p-type GaInAs contact layer 111, for example, using a normal CVD method and a photolithography technique. Here, the SiO$_2$ mask 112 is a striped etching mask having a thickness of approximately 400 nm and a width of approximately 1.3 μm.

Thereafter, as illustrated in FIG. 8A, etching of the semiconductor stacked structure formed in such a manner as described above is carried out, for example, using a dry etching method, to the depth to which the n-type InP substrate 101 is etched, for example, by approximately 0.7 μm so that a striped mesa structure (mesa stripe) 8 is worked out.

Figure 8B:
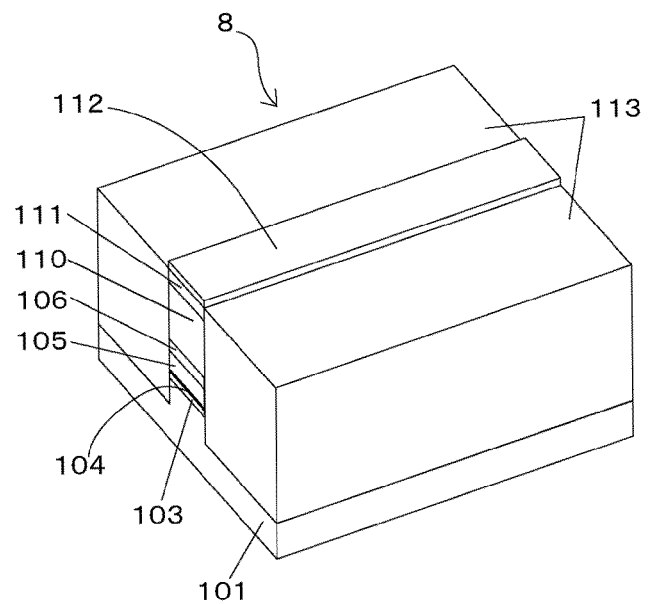

Then, a current blocking layer 113 made from, for example, Fe-doped type semi-insulating InP is grown on both sides of the mesa structure 8 as illustrated in FIG. 8B, for example, using a MOVPE method. By the growth, a semi-insulating buried heterostructure (SI-BH structure; high-resistance buried structure) is formed.

Then, the etching mask 112 is removed by, for example, hydrogen fluoride and then, as illustrated in FIG. 9A, the p-type GaInAs contact layer 111 in any other region than the region which later becomes the active region 1 is removed using a normal photolithography technique and a normal etching method.

Thereafter, a SiO$_2$ passivation film 114 is formed as illustrated in FIGS. 9A and 9B. Then, the SiO$_2$ passivation film 114 is removed using a normal photolithography technique and a normal etching method so that a window is opened only at a location above the p-type GaInAs contact layer 111 of the region which later becomes the active region 1. Thereafter, a p-side electrode 115 and an n-side electrode 116 are formed. It is to be noted that FIG. 9B is a sectional view taken along lines A-A' and B-B' in FIG. 9A.

Then, as illustrated in FIGS. 9A and 9B, anti-reflection coatings 117 and 118 are formed on both end faces of the device, and the device is completed thereby.

Accordingly, with the semiconductor laser according to the present embodiment, a device having a distributed reflector type laser structure is configured such that appearance of multi-mode oscillation or mode hopping can be prevented around the threshold current or where driving current is increased to increase the current injection amount. Consequently, there is an advantage that enhancement of the yield of devices with which single-longitudinal mode oscillation is obtained can be anticipated.

Figure 10:
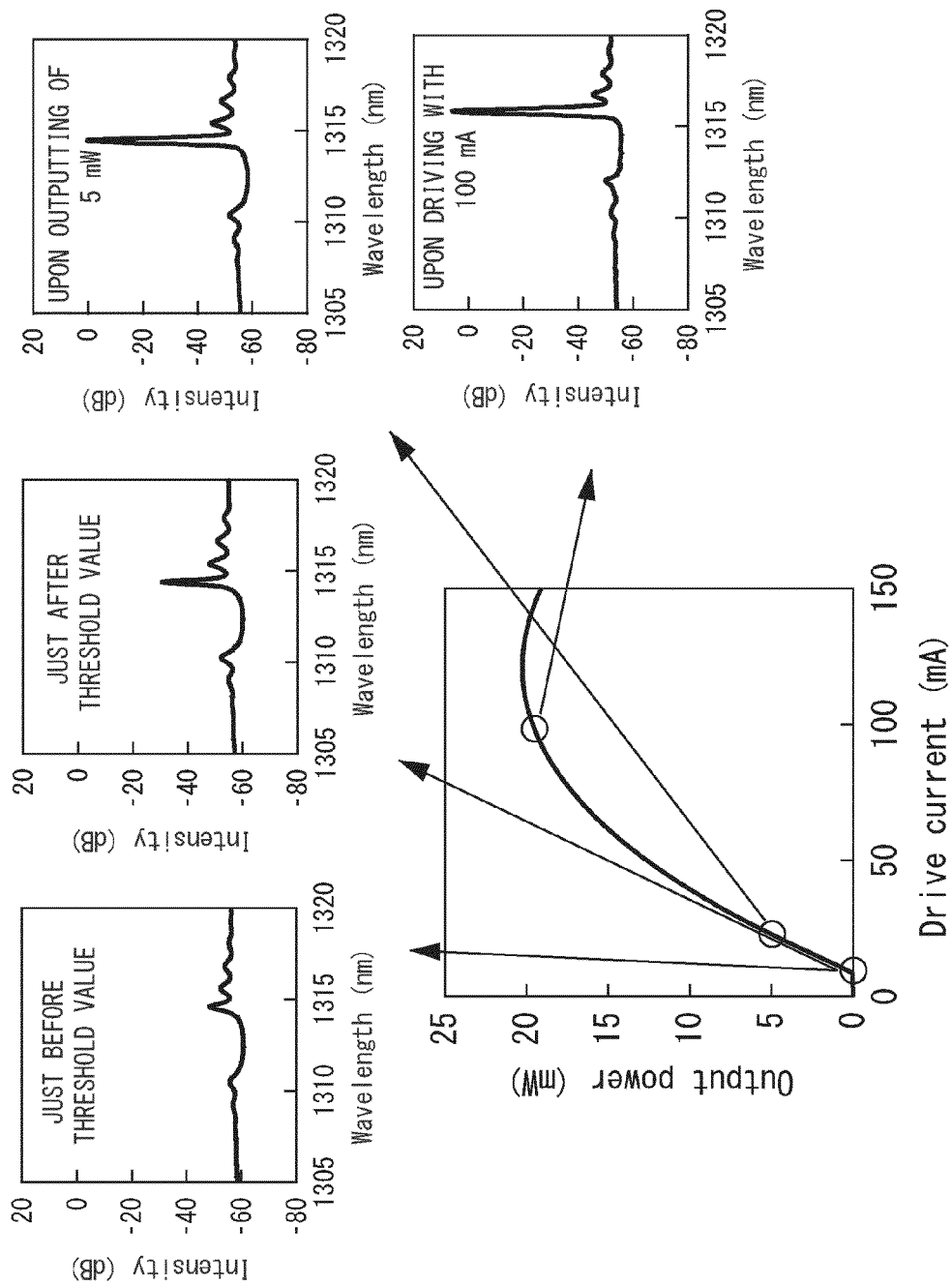
FIG. 10 is a view illustrating an effect of the semiconductor laser according to the first embodiment.

Actually, with the device fabricated by the fabrication method of the embodiment described above, stabilized single-longitudinal mode operation was obtained wherein mode hopping does not appear around the threshold current and mode hopping does not appear up to driving current approximately 150 mA as illustrated in FIG. 10.

Second Embodiment

Now, a semiconductor laser according to a second embodiment is described with reference to FIGS. 11A to 14C.

The semiconductor laser (DR laser) according to the present embodiment is different from that of the first embodiment described above in four points described below.

In particular, the first different point is a point that a GaInAsP compound semiconductor material systems are used for the quantum well active layer. The second different point is a point that the distributed reflector region is provided so as to continue to the rear end face side and the front end face side in the active region. The third different point is a point that the period of the reflection diffraction grating in the distributed reflector region on the rear end face side varies nonlinearly. The fourth different point is a point that the effective diffraction grating period of the distributed reflector region is equal to the period of the diffraction grating in the active region at the position which the distributed reflector region contacts with the active region.

Figures 11A, 11B:
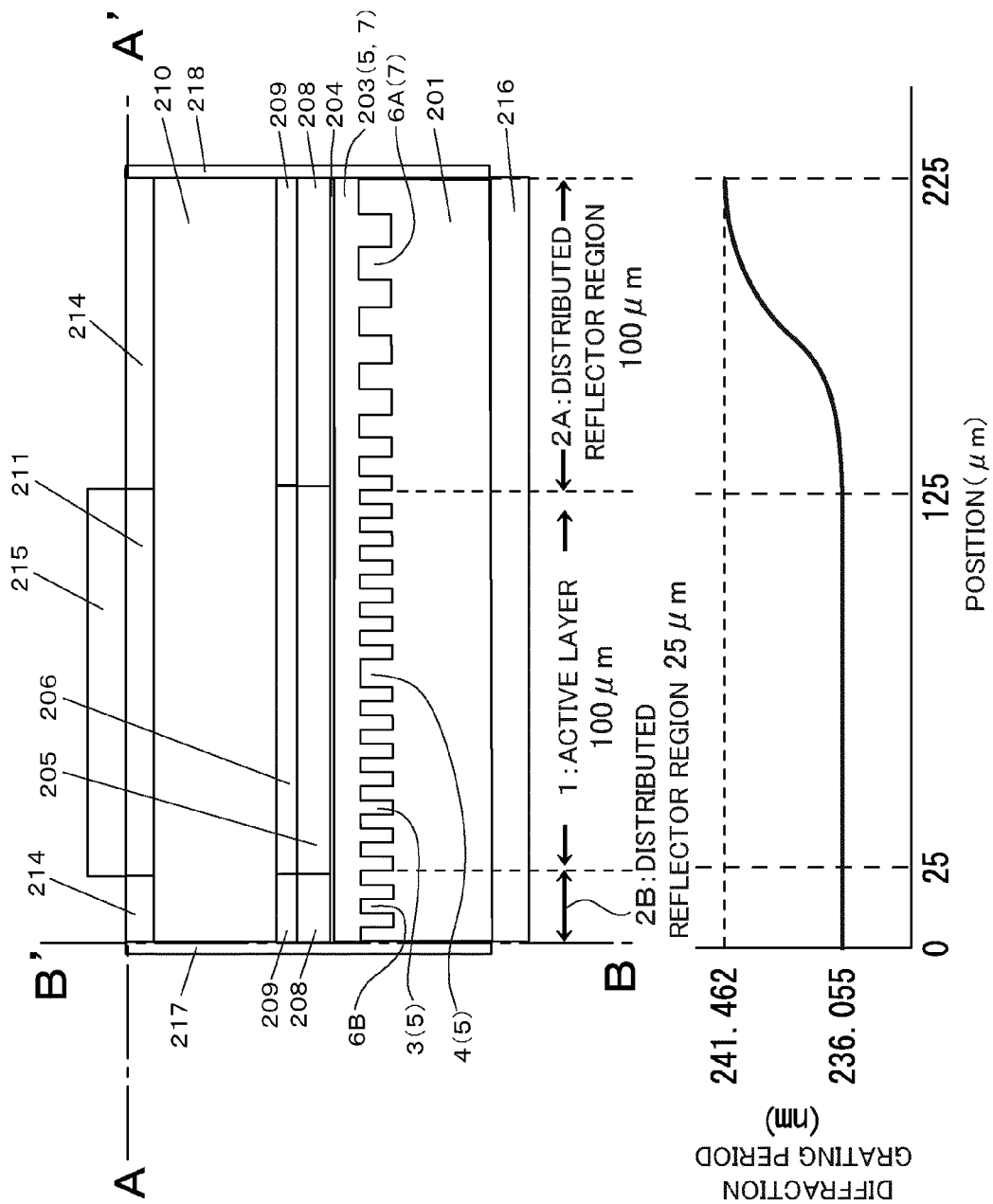
FIG. 11A is a schematic sectional view illustrating a configuration of a semiconductor laser according to a second embodiment.
FIG. 11B is a view illustrating a variation of a diffraction grating period in a direction of a cavity of the semiconductor laser according to the second embodiment.

In the present embodiment, as illustrated in FIG. 11A, the active region 1 includes a diffraction grating layer 5 which includes a diffraction grating 3 including a phase shift 4 and an n-type doped GaInAsP layer 203, an undoped GaInAsP/GaInAsP quantum well active layer 205 as a waveguide core layer, a p-type doped InP cladding layer 206, a p-type InP cladding layer 210, and a p-type GaInAs contact layer 211.

Here, the diffraction grating layer 5 is formed by burying the diffraction grating 3, which includes the phase shift 4 and formed on the surface of an n-type doped InP substrate 201, with the n-type doped GaInAsP layer 203. Further, the n-type doped GaInAsP layer 203 has a compositional wavelength of approximately 1.25 μm and a thickness of approximately 120 nm. Meanwhile, the undoped GaInAsP/GaInAsP quantum well active layer 205 has a compositional wavelength of approximately 1,550 nm.

Here, the length of the active region 1 is approximately 100 μm. Further, as illustrated in FIG. 11B, the period of the diffraction grating 3 in the active region 1 is fixed to approximately 236.055 nm. Further, the coupling coefficient and the phase of the diffraction grating 3 are fixed in the active region 1. Furthermore, the equivalent refractive index of the waveguide is fixed along the direction of the cavity in the active region 1. Further, the λ/4 phase shift 4 whose phase is shifted by π radians (corresponding to a λ/4 shift) is provided on the rear end face side by approximately 15 μm with respect to the center in the active region 1.

As illustrated in FIG. 11A, distributed reflector regions 2A and 2B are provided so as to continue to the front end face side and the rear end face side of the active region 1. In the present embodiment, the distributed reflector region 2B having a length of approximately 25 μm is provided on the front end face side continuing to the active region 1 and the distributed reflector region 2A having a length of approximately 100 μm is provided on the rear end face side continuing to the active region 1. In particular, continuing to the active region 1, a reflection diffraction grating 6B is patterned over the length of approximately 25 μm to the front end face side and a reflection diffraction grating 6A is patterned over the length of approximately 100 μm to the rear end face side.

In this manner, the length along the direction of the cavity of the distributed reflector region 2B provided on the front end face side in the active region 1 is smaller than that of the distributed reflector region 2A provided on the rear end face side in the active region 1. This is because, since laser light is outputted from the front end face side of the device, it is intended to decrease the reflectance in the distributed reflector region 2B on the front end face side. Here, the phase of the diffraction grating in the active region 1 and the phases of the reflection diffraction gratings in the distributed reflector regions 2A and 2B are equal to each other.

The distributed reflector regions 2A and 2B on the rear end face side and the front end face side include a light guide layer (passive waveguide core layer) 208 which does not generate the gain and the reflection diffraction gratings 6A and 6B, respectively. In particular, the distributed reflector regions 2A and 2B on the rear end face side and the front end face side individually include a passive waveguide on which the reflection diffraction gratings 6A and 6B are provided. The light guide layers 208 on the rear end face side and the front end face side individually have a composition of 1.25 μm so as to prevent appearance of absorption loss. It is to be noted that, in FIG. 11A, reference numeral 214 denotes a $SiO_2$ passivation film.

In the present embodiment, the distributed reflector regions 2A and 2B include a reflection diffraction grating layer 7 including the reflection diffraction gratings 6A and 6B and the undoped GaInAsP layer 203, an undoped GaInAsP light guide layer 208 as a waveguide core layer, an undoped InP layer 209 and a p-type InP cladding layer 210.

Here, the reflection diffraction grating layer 7 is formed by burying the reflection diffraction gratings 6A and 6B formed on the surface of the n-type doped InP substrate 201 with the undoped GaInAsP layer 203. Further, the undoped GaInAsP layer 203 has a compositional wavelength of approximately 1.25 μm and a thickness of approximately 120 nm. Further, the undoped GaInAsP light guide layer 208 has a compositional wavelength of approximately 1.25 μm and a thickness of approximately 230 nm.

Particularly, in the present embodiment, the effective diffraction grating period of the distributed reflector region on the rear end face side varies along the direction of the cavity.

In particular, as illustrated in FIG. 11B, in the distributed reflector region 2A on the rear end face side, the period of the reflection diffraction grating 6A varies along the direction of the cavity (lengthwise direction of the cavity; direction along the optical waveguide). In particular, a chirp diffraction grating is used as the reflection diffraction grating 6A.

Here, the effective diffraction grating period of the distributed reflector region 2A on the rear end face side increases as the distance from the active region 1 increases. Further, the effective diffraction grating period of the distributed reflector region 2A on the rear end face side is equal to the period of the diffraction grating 3 in the active region 1 at the position which the distributed reflector region 2A contacts with the active region 1.

In particular, as illustrated in FIG. 11B, in the distributed reflector region 2A on the rear end face side, the period of the reflection diffraction grating 6A increases as the distance from the active region 1 increases. In the present embodiment, the period of the reflection diffraction grating 6A on the rear end face side varies nonlinearly such that it is approximately 236.055 nm on the interface with the active region 1 and is approximately 241.462 nm on the rear end face. Here, the period of the reflection diffraction grating 6A on the rear end face side varies nonlinearly such that the period is point-symmetrical with respect to the center of the reflection diffraction grating 6A on the rear end face side and exhibits a function form of the tank type. Further, in the distributed reflector region 2A on the rear end face side, the period of the reflection diffraction grating 6A is equal to the period of the diffraction grating 3 in the active region 1 at the position which the distributed reflector region 2A contacts with the active region 1. In the present embodiment, both of the period of the reflection diffraction grating 6A and the period of the diffraction grating 3 in the active region 1 are approximately 236.055 nm at the position which the distributed reflector region 2A on the rear end face side and the active region 1 contact with each other.

On the other hand, the period of the reflection diffraction grating 6B in the distributed reflector region 2B on the front end face side is fixed to approximately 236.055 nm. Here, the period of the reflection diffraction grating 6B in the distributed reflector region 2B on the front end face side is equal to the period of the diffraction grating 3 in the active region 1.

In this manner, while the period of the reflection diffraction grating 6A in the distributed reflector region 2A on the rear end face side varies along the direction of the cavity, the period of the reflection diffraction grating 6B in the distributed reflector region 2B on the front end face side is fixed. This is because the length of the distributed reflector region 2B on the front end face side is set small in order to decrease the reflectance and, as a result, the effective reflection band of the distributed reflector region 2B on the front end face side is expanded. It is to be noted that, also in the distributed reflector region 2B on the front end face side, similarly as in the distributed reflector region 2A on the rear end face side described above, the period of the reflection diffraction grating 6B may vary along the direction of the cavity. In this instance, the period of the reflection diffraction grating 6B in the distributed reflector region 2B on the front end face side may be set so as to increase as the distance from the active region 1 increases.

Figure 14A:
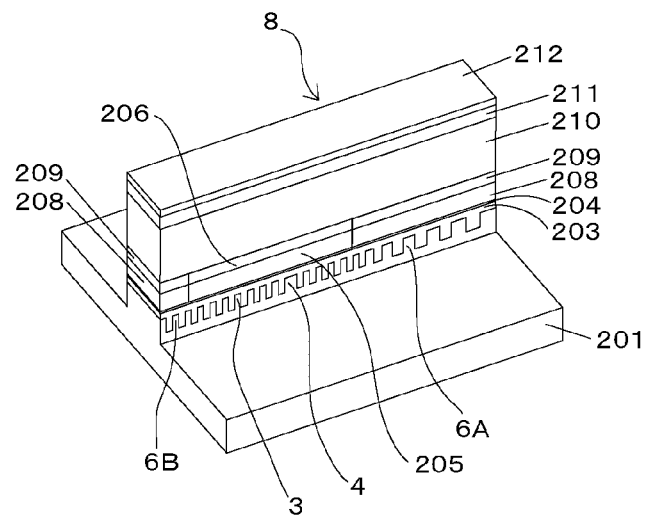
FIGS. 14A to 14C are schematic perspective views illustrating the fabrication method of the semiconductor laser according to the second embodiment.

It is to be noted that the distributed reflector regions 2A and 2B on the front end face side and the rear end face side extend rectilinearly (straight-linearly) along the direction of the cavity (refer to FIG. 14A). Further, in the distributed reflector regions 2A and 2B on the front end face side and the rear end face side, the equivalent refractive index of the waveguide (light guide layer) is fixed along the direction of the cavity. Further, in the distributed reflector regions 2A and 2B on the front end face side and the rear end face side, the coupling coefficients and the phases of the diffraction gratings 6A and 6B are fixed.

Further, the coupling coefficient of the diffraction grating 3 in the active region 1 and the coupling coefficients of the reflection diffraction gratings 6A and 6B in the distributed reflector regions 2A and 2B on the front end face side and the rear end face side are equal to each other. In particular, as illustrated in FIG. 11B, the depth of the diffraction grating 3 in the active region 1 and the depths of the reflection diffraction gratings 6A and 6B in the distributed reflector regions 2A and 2B on the front end face side and the rear end face side are equal to each other. In the present embodiment, all of the depth of the diffraction grating 3 in the active region 1 and the depths of the reflection diffraction gratings 6A and 6B in the distributed reflector regions 2A and 2B on the front end face side and the rear end face side are approximately 100 nm. Further, the duty ratio (here, approximately 50%) of the diffraction grating 3 in the active region 1 and the duty ratios of the reflection diffraction gratings 6A and 6B in the distributed reflector regions 2A and 2B on the front end face side and the rear end face side are also equal to each other.

Further, in the present embodiment, since current injection is carried out only to the active region 1, a current injection electrode (p-side electrode) 215 is provided only in the active region 1 as illustrated in FIG. 11A. Further, an n-side electrode 216 is provided on the reverse face side of the n-type doped InP substrate 201. Furthermore, in the present distributed reflector type laser, anti-reflection coatings (anti-reflection films) 217 and 218 are provided on both end faces.

Now, a fabrication method of the semiconductor laser (DR laser) according to a particular example of the configuration of the present embodiment is described with reference to FIGS. 12A to 14C.

Figure 12A:
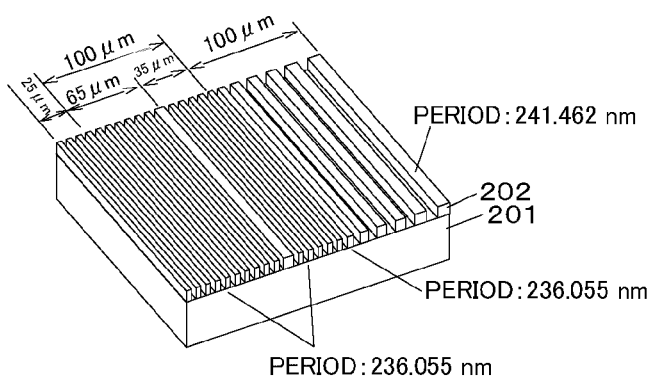
FIGS. 12A to 12D are schematic perspective views illustrating a fabrication method of the semiconductor laser according to the second embodiment.

First, as illustrated in FIG. 12A, a mask 202 made from an electron beam resist (ZEP 520, a product of Japan Zeon) and having a diffraction grating pattern is formed, for example, by an electron beam exposure method on the surface of an n-type doped InP substrate 201. It is to be noted that the diffraction grating pattern includes a diffraction grating pattern which forms the diffraction grating 3 (including the phase shift 4) in the active region 1 and a reflection diffraction grating pattern which forms the reflection diffraction gratings 6A and 6B in the distributed reflector regions 2A and 2B on the front end face side and the rear end face side.

Figure 12B:
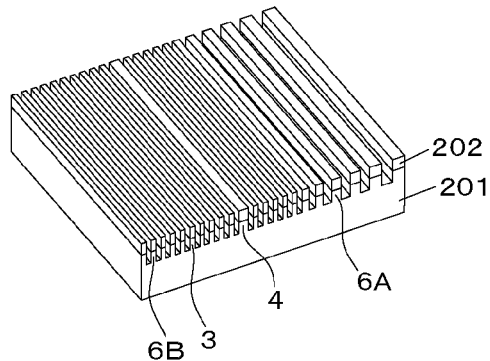

Then, part of the surface of the n-type doped InP substrate 201 is removed, for example, by reactive ion etching (RIE) by ethane/hydrogen mixed gas using the mask 202 to transfer the diffraction grating pattern as illustrated in FIG. 12B. Here, the etching is stopped halfway of the n-type InP substrate 201.

Consequently, the diffraction grating 3 (including the phase shift 4) in the active region 1 and the reflection diffraction gratings 6A and 6B in the distributed reflector regions 2A and 2B are formed collectively. In particular, the diffraction grating 3 having the $\lambda/4$ phase shift 4 whose phase is shifted by $\pi$ radians (corresponding to a $\lambda/4$ shift) is formed on the rear end face side by approximately 15 μm with respect to the center of the active region 1 over the overall length (here, approximately 100 μm) of a region which later becomes the active region 1 of individual devices (refer to FIG. 12A). Further, the reflection diffraction grating 6B is formed over the overall length (here, approximately 25 μm) of the region which later becomes the distributed reflector region 2B on the front end face side continuing to the diffraction grating 3 in the active region 1 (refer to FIG. 12A). Further, the reflection diffraction grating 6A is formed over the overall length (here, approximately 100 μm) of the region which later becomes the distributed reflector region 2A on the rear end face side continuing to the diffraction grating 3 in the active region 1 (refer to FIG. 12A).

In the present embodiment, the period of the diffraction grating 3 formed in the region which later becomes the active region 1 is fixed to approximately 236.055 nm (refer to FIG. 12A). Further, in the active region 1, the coupling coefficient and the phase of the diffraction grating 3 are fixed. Further, in the active region 1, the equivalent refractive index of the waveguide is fixed along the direction of the cavity.

Further, the period of the reflection diffraction grating 6A formed in the region which later becomes the distributed reflector region 2A on the rear end face side varies nonlinearly such that it is approximately 236.055 nm on the interface with the active region 1 and is approximately 214.462 nm on the rear end face (refer to FIG. 12A) and besides it is point-symmetrical with respect to the center of the distributed reflector region and exhibits a function form of the tank type (refer to FIG. 11B). Here, the period of the reflection diffraction grating 6A in the distributed reflector region 2A is equal to the period of the diffraction grating 3 in the active region 1 at the position which the distributed reflector region 2A contacts with the active region 1. Further, in the distributed reflector region 2A, the coupling coefficient and the phase of the diffraction grating 6A are fixed.

Further, the period of the reflection diffraction grating 6B formed in the region which later becomes the distributed reflector region 2B on the front end face side is fixed to approximately 236.055 nm (refer to FIGS. 12A and 11B).

Further, the depth of the diffraction grating 3 in the active region 1 and the depths of the reflection diffraction gratings 6A and 6B in the distributed reflector regions 2A and 2B are all approximately 100 nm and equal to each other. Further, also the duty ratio (here, approximately 50%) of the diffraction grating 3 in the active region 1 and the duty ratios of the reflection diffraction gratings 6A and 6B in the distributed reflector regions 2A and 2B are equal to each other. In other words, the coupling coefficient of the diffraction grating 3 in the active region 1 and the coupling coefficients of the reflection diffraction gratings 6A and 6B in the distributed reflector regions 2A and 2B are equal to each other. Further, the phase of the diffraction grating 3 in the active region 1 and the phases of the reflection diffraction gratings 6A and 6B in the distributed reflector regions 2A and 2B are also equal to each other.

Figure 12C:
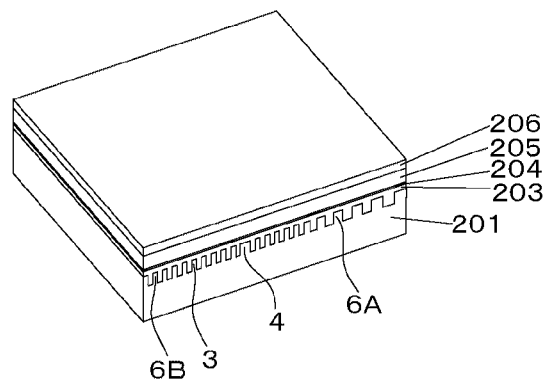

Then, the mask 202 is removed from the surface as illustrated in FIG. 12C using a normal resist removing process. Thereafter, an n-type doped GaInAsP layer (guide layer) 203 is grown, for example, using a MOVPE method on the surface of the n-type InP substrate 201 on which the diffraction grating pattern is formed. Here, the n-type doped GaInAsP layer 203 has a compositional wavelength of approximately 1.25 μm and a thickness of approximately 120 nm. Consequently, the grooves (diffraction grating pattern) formed by stopping etching halfway of the n-type InP substrate 201 are buried with the n-type doped GaInAsP layer 203.

Then, an n-type doped InP layer 204, an undoped GaInAsP/GaInAsP quantum well active layer 205, and a p-type doped InP cladding layer 206 are grown in order on the n-type doped GaInAsP layer 203 as illustrated in FIG. 12C, for example, by a MOVPE method. Here, the thickness of the n-type doped InP layer 204 is approximately 20 nm. Further, the thickness of the p-type doped InP cladding layer 206 is approximately 250 nm.

Here, the quantum well active layer 205 is made from a GaInAsP compound semiconductor material systems. In particular, the quantum well active layer 205 is formed from an undoped GaInAsP well layer and an undoped GaInAsP barrier layer. Here, the undoped GaInAsP well layer has a thickness of approximately 5.1 nm and a compression strain amount of approximately 1.2%. Meanwhile, the undoped GaInAsP barrier layer has a compositional wavelength of approximately 1.20 μm and a thickness of approximately 10 nm. Further, the stack number of the quantum well active layer 205 is 15 layers and the light emission wavelength of the quantum well active layer 205 is approximately 1,550 nm.

It is to be noted that undoped GaInAsP-SCH layers (light guide layers) may be provided above and below the quantum well active layer 205 in such a manner as to sandwich the quantum well active layer 205 therebetween. Here, the undoped GaInAsP-SCH layer has a compositional wavelength of approximately 1.15 μm and a thickness of approximately 20 nm.

Figure 12D:
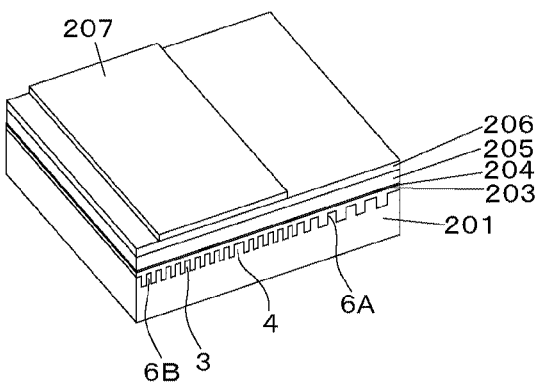

Then, a striped SiO$_2$ mask (etching mask) 207 is formed on the surface of the p-type doped InP cladding layer 206 as illustrated in FIG. 12D using a normal CVD method and a photolithography technique so as to cover the region which later becomes the active region 1. Here, the thickness of the SiO$_2$ mask 207 is approximately 400 nm.

Figure 13A:
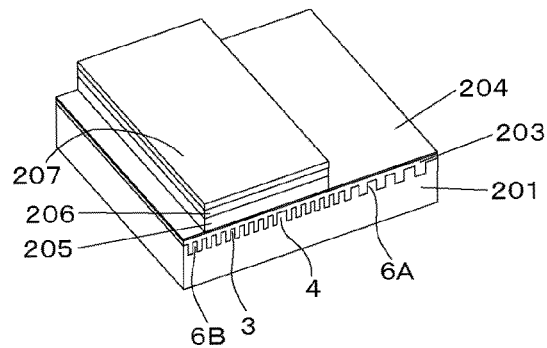
FIGS. 13A to 13D are schematic perspective views illustrating the fabrication method of the semiconductor laser according to the second embodiment.

Then, the p-type doped InP cladding layer 206 and the quantum well active layer 205, that is, from the surface of the p-type doped InP cladding layer 206 to the surface of the n-type doped InP layer 204 are removed as illustrated in FIG. 13A, for example, by etching using the mask 207.

Figure 13B:
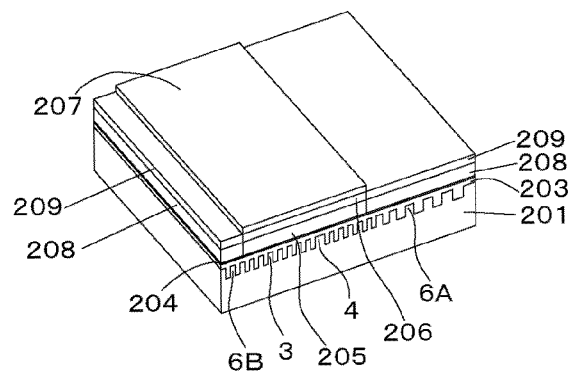

Thereafter, an undoped GaInAsP layer 208 and an undoped InP layer 209 are grown in order on the n-type doped InP layer 204 as illustrated in FIG. 13B, for example, by a MOVPE method. Here, the undoped GaInAsP layer 208 has a compositional wavelength of approximately 1.25 μm and a thickness of approximately 230 nm. Further, the thickness of the undoped InP layer 209 is approximately 250 nm. At this time, by selective growth, the layers 208 and 209 are not grown on the SiO$_2$ mask 207 but are grown only on the n-type doped InP layer 204 exposed on the surface.

Figure 13C:
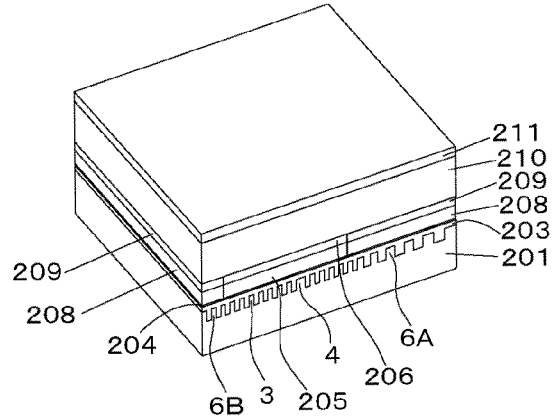

Thereafter, the SiO$_2$ mask 207 is removed and then, for example, a p-type InP cladding layer 210 and a p-type GaInAs contact layer 211 are stacked successively on the overall face of the semiconductor crystal wafer as illustrated in FIG. 13C using the MOVPE method again. Here, the p-type InP cladding layer 210 is configured by doping Zn therein and has a thickness of approximately 2.5 μm. Meanwhile, the p-type GaInAs contact layer 211 is configured by doping Zn therein and has a thickness of approximately 300 nm.

Figure 13D:
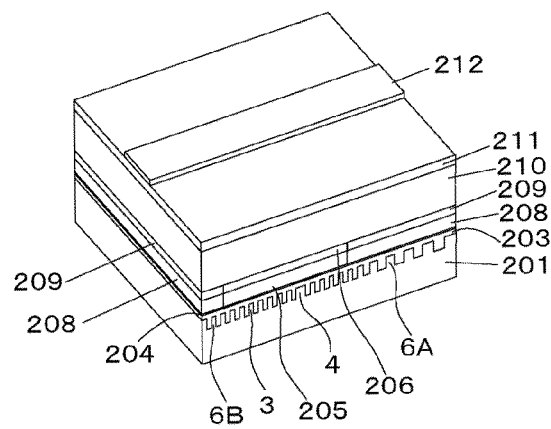

Then, a SiO$_2$ mask 212 is formed on the surface of the p-type GaInAs contact layer 211 as illustrated in FIG. 13D, for example, using a normal CVD method and a photolithography technique. Here, the SiO$_2$ mask 212 is a striped etching mask having a thickness of approximately 400 nm and a width of approximately 1.5 μm.

Thereafter, etching of the semiconductor stacked structure formed in such a manner as described above is carried out to the depth to which the n-type InP substrate 201 is etched, for example, by approximately 0.7 μm as illustrated in FIG. 14A, for example, using a dry etching method so that a striped mesa structure (mesa stripe) 8 is worked out.

Figure 14B:
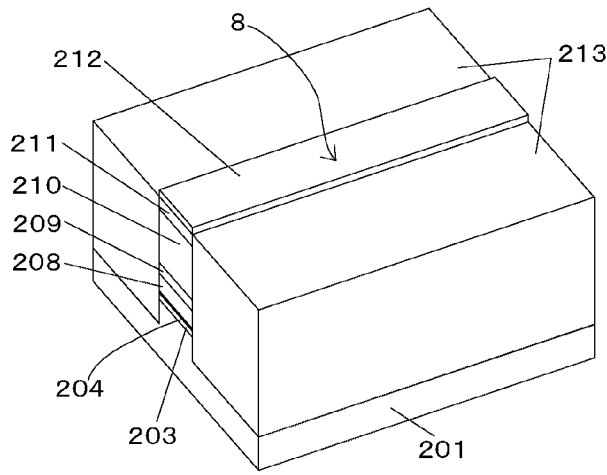

Then, a current blocking layer 213 made from, for example, Fe-doped type semi-insulating InP is grown on both sides of the mesa structure 8 as illustrated in FIG. 14B, for example, using a MOVPE method. Consequently, a semi-insulating buried heterostructure (SI-BH) is formed.

Figure 14C:
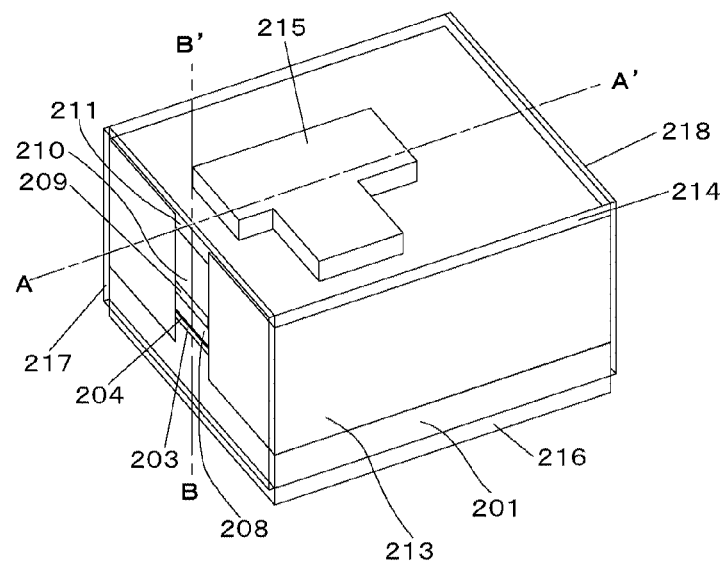

Then, the etching mask 212 is removed, for example, by hydrogen fluoride and then the p-type GaInAs contact layer 211 in any other region than the region which later becomes the active region is removed as illustrated in FIG. 14C by a normal photolithography technique and etching.

Thereafter, a SiO$_2$ passivation film 214 is formed as illustrated in FIG. 14C. Then, the SiO$_2$ passivation film is removed using a normal photolithography technique and etching so that a window is opened only at a location above the p-type GaInAs contact layer 211 in the region which later becomes the active region 1. Thereafter, a p-side electrode 215 and an n-side electrode 216 are formed. It is to be noted that FIG. 11A is a sectional view taken along lines A-A' and B-B' in FIG. 14C.

Then, as illustrated in FIG. 14C, anti-reflection coatings 217 and 218 are formed on both end faces of the device, and the device is completed thereby.

It is to be noted that, since details of the configuration of the other part are same as those in the first embodiment described above and the modification to the first embodiment, description of them is omitted here.

Accordingly, with the semiconductor laser according to the present embodiment, a device having a distributed reflector type laser structure can be configured such that occurrence of multi-mode oscillation or mode hopping can be prevented around the threshold current or where driving current is gradually increased to increase the current injection amount. Consequently, there is an advantage that enhancement of the yield of devices with which single-longitudinal mode oscillation is obtained can be anticipated.

Actually, in the device produced by the fabrication method of the embodiment described above, stabilized single-longitudinal mode operation was obtained wherein mode hopping does not appear around the threshold current and mode hopping does not appear up to driving current approximately 150 mA (refer to FIG. 10).

Third Embodiment

Now, a semiconductor laser according to a third embodiment is described with reference to FIGS. 15A to 18.

The semiconductor laser (DR laser) according to the present embodiment is different from that of the first embodiment described hereinabove in three points described below.

Figure 16:
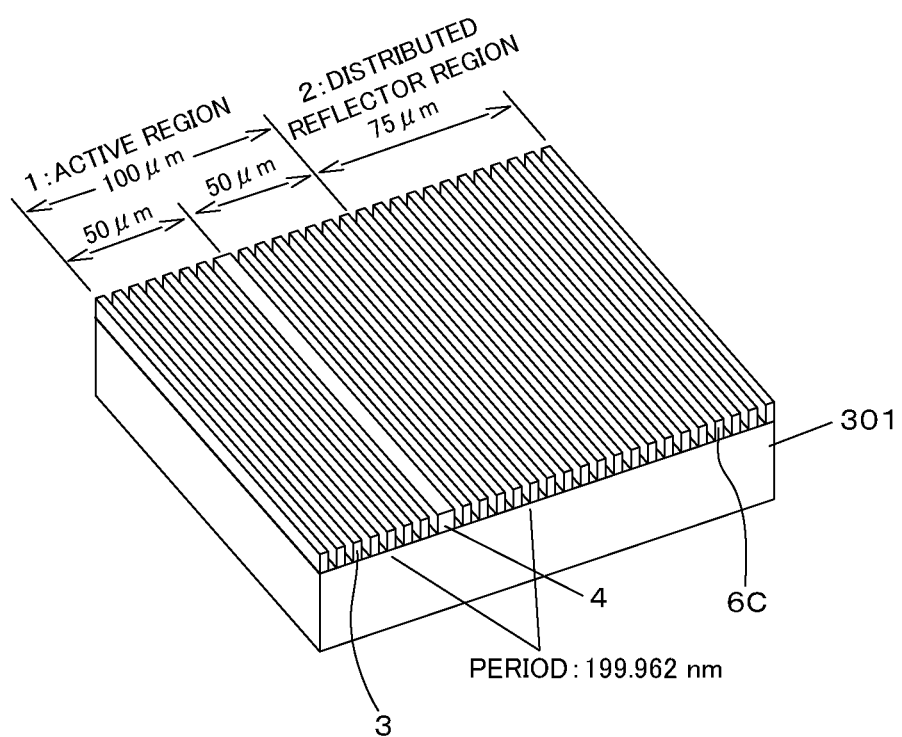
FIG. 16 is a schematic perspective view illustrating a fabrication method of the semiconductor laser according to the third embodiment.

In particular, the first different point is a point that the period of a reflection diffraction grating 6C in the distributed reflector region 2 is fixed and a passive waveguide 10 on which the reflection diffraction grating 6C is provided is curved along the direction of the cavity as illustrated in FIG. 15A. The second different point is a point that a phase shift (λ/4 phase shift) is provided at the center in the active region as illustrated in FIG. 16. The third different point is a point that the effective diffraction grating period is equal to the period of the diffraction grating 3 in the active region 1 at the position which the distributed reflector region 2 contacts with the active region 1 as illustrated in FIG. 15D.

In the present embodiment, both of the period of the diffraction grating 3 in the active region 1 and the period of the reflection diffraction grating 6C in the distributed reflector region 2 are approximately 199.505 nm and are fixed (refer to FIG. 16). Further, the λ/4 phase shift 4 whose phase is shifted by π radians (corresponding to a λ/4 shift) is provided at the center in the active region 1 (refer to FIG. 16).

Further, in the present embodiment, the effective diffraction grating period of the distributed reflector region 2 varies along the direction of the cavity.

In particular, as illustrated in FIG. 15A, the period of the reflection diffraction grating 6C in the distributed reflector region 2 is fixed and the passive waveguide 10 (distributed reflector region 2; light guide layer 308) is curved moderately toward a direction away from a boundary position with the active region 1. By curving the distributed reflector region 2 along the direction of the cavity in this manner, the optical path length (optical length) is varied along the direction of the cavity, and as a result, the effective diffraction grating period (optical diffraction grating period) of the distributed reflector region 2 is varied along the direction of the cavity.

In the present embodiment, the tangential angle of the passive waveguide 10 increases as the distance from the active region 1 increases as illustrated in FIGS. 15A to 15C. By setting the tangential angle of the passive waveguide 10 in this manner, the curvature of the passive waveguide 10 is set and the effective diffraction grating period of the distributed reflector region 2 increases as the distance from the active region 1 increases.

Here, the effective diffraction grating period of the distributed reflector region 2 is approximately 199.505 nm on the interface with the active region 1 and is approximately 204.073 nm on the rear end face, and the effective diffraction grating period varies linearly as illustrated in FIG. 15D.

Here, if the tangential angle is represented by θ, the effective diffraction grating period at a position x is represented by Λ(x) and the period of the reflection diffraction grating 6C is represented by Λ0, then the effective diffraction grating period Λ(x) at the position x can be represented equivalently by the following expression (1):

$$\Lambda(x) = \Lambda 0 / \cos \theta \quad (1)$$

Therefore, the tangential angle θ is set such that it varies in such a manner as illustrated in FIG. 15C as the distance from the active region 1 increases. In this instance, the tangential angle θ can be represented by the following expression (2):

$$\theta = \arccos \{1/[1+0.00023*(x-100)]\} \quad (2)$$

Here, the tangential angle θ is approximately 0 (deg.) on the interface with the active region 1 and is approximately 12 (deg.) on the rear end face, and the tangential angle varies in a curved fashion (nonlinearly).

By varying the tangential angle θ in this manner, the effective diffraction grating period Λ(x) at the position x is varied rectilinearly from approximately 199.505 nm to approximately 204.073 nm as illustrated in FIG. 15D.

Further, the effective diffraction grating period of the distributed reflector region 2 is equal to the period of the diffraction grating 3 in the active region 1 at the position which the distributed reflector region 2 contacts with the active region 1. In the present embodiment, both of the effective diffraction grating period of the distributed reflector region 2 and the period of the diffraction grating 3 in the active region 1 are approximately 199.505 nm at the position at which the distributed reflector region 2 and the active region 1 contact with each other.

Figure 17A:
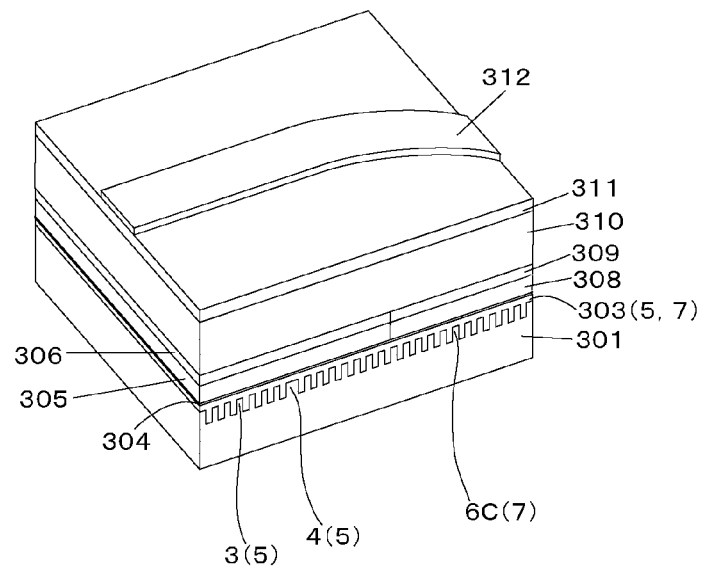
FIGS. 17A to 17C are schematic perspective views illustrating the fabrication method of the semiconductor laser according to the third embodiment.
Figure 17B:
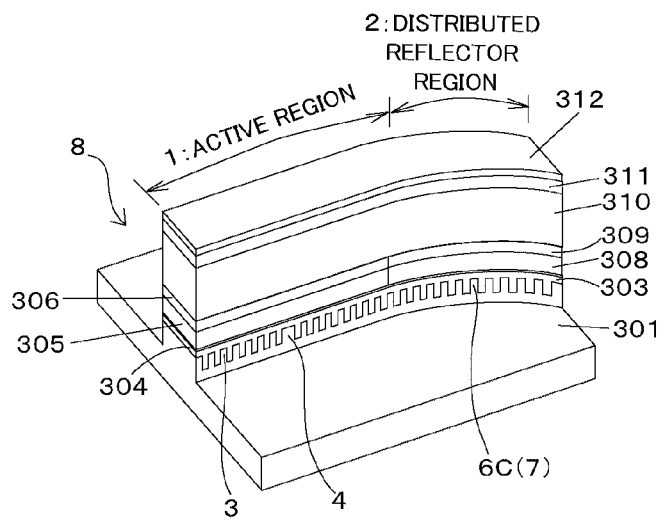
Figure 17C:
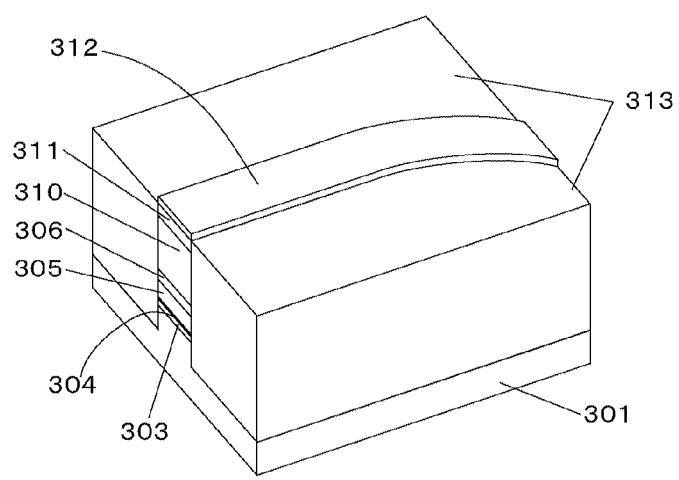
Figure 18:
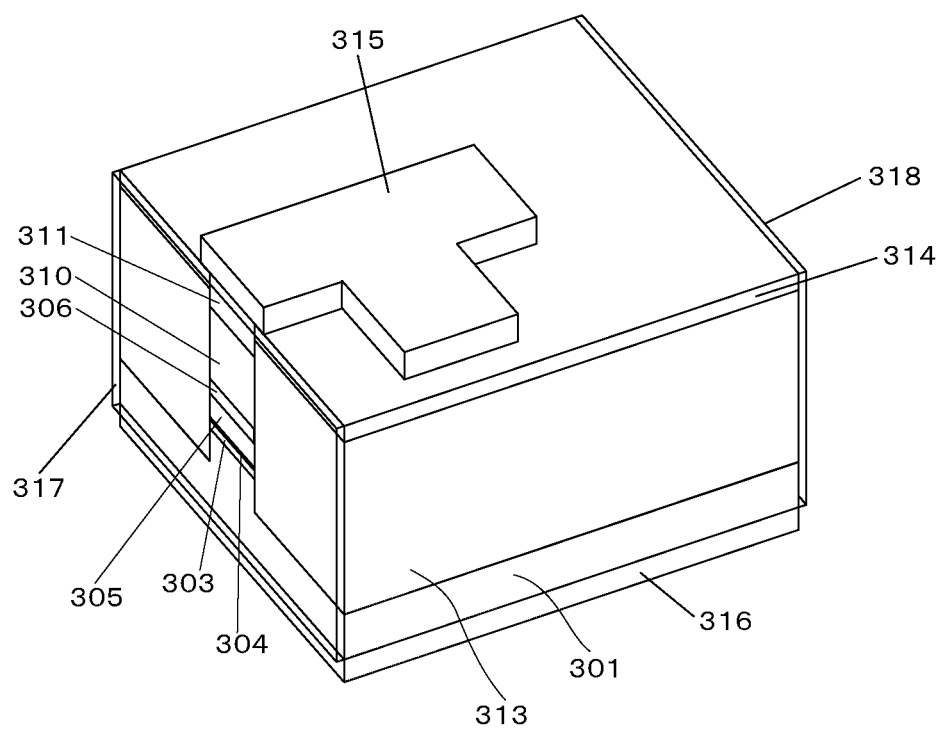
FIG. 18 is a schematic perspective view illustrating the fabrication method of the semiconductor laser according to the third embodiment.

It is to be noted that the present semiconductor laser includes the active region 1 and the distributed reflector region 2 as illustrated in FIGS. 16 to 18. Further, the active region 1 includes a diffraction grating layer 5 which includes the diffraction grating 3 including the phase shift 4 formed on the surface of an n-type doped InP substrate 301 and an n-type doped GaInAsP layer 303, an n-type doped InP layer 304, an undoped AlGaInAs/AlGaInAs quantum well active layer 305, a p-type doped InP cladding layer 306, a p-type InP cladding layer 310, and a p-type GaInAs contact layer 311. Further, the distributed reflector region 2 includes a reflection diffraction grating layer 7 which includes the reflection diffraction grating 6C formed on the surface of the n-type doped InP substrate 301 and an undoped GaInAsP layer 303, the n-type doped InP layer 304, an undoped AlGaInAs light guide layer (passive waveguide core layer) 308, an undoped InP layer 309, and a p-type InP cladding layer 310. Further, since current injection is carried out only to the active region 1, a current injection electrode (p-side electrode) 315 is provided only for the active region 1. Further, an n-side electrode 316 is provided on the reverse face side of the n-type doped InP substrate 301. Furthermore, in the present distribution reflection type laser, anti-reflection coatings (anti-reflection films) 317 and 318 are provided on both end faces. It is to be noted that, in FIG. 18, reference numeral 314 denotes a SiO₂ passivation film.

Now, a fabrication method of the semiconductor laser (DR laser) according to a particular example of the configuration of the present embodiment is described with reference to FIGS. 16 to 18.

First, the processes up to the process of stacking the p-type GaInAs contact layer 311 except the process of forming the diffraction grating 3 including the phase shift 4 and the reflection diffraction grating 6C on the surface of the n-type InP substrate 301 are similar to the processes (refer to FIGS. 6C to 6D and 7A to 7C) of the first embodiment described above.

In the present embodiment, the step at which the diffraction grating 3 including the phase shift 4 and the reflection diffraction grating 6C are formed on the surface of the n-type InP substrate 301 is carried out in such a manner as described below.

In particular, as illustrated in FIG. 16, the diffraction grating 3 having a λ/4 phase shift 4 whose phase is shifted by π radians (corresponding to a λ/4 phase) at the center of the active region 1 and having a fixed period is formed over the overall length (here, approximately 100 μm) of the region which later becomes the active region 1 of the individual devices. Here, the period of the diffraction grating 3 is approximately 199.505 nm. Further, the reflection diffraction grating 6C which has the period equal to that of the diffraction grating 3 in the active region 1 and in which the period is fixed is formed over the overall length (here, approximately 75 μm) of the region which later becomes the distributed reflector region 2 continuing to the diffraction grating 3 in the active region 1. Here, the period of the reflection diffraction grating 6C is approximately 199.505 nm.

Then, the processes up to the process of stacking the p-type GaInAs contact layer 311 are carried out using a method similar to that of the process (refer to FIGS. 6C to 6D and 7A to 7C) of the first embodiment described above.

Thereafter, a SiO₂ mask 312 is formed on the surface of the p-type GaInAs contact layer 311 as illustrated in FIG. 17A, for example, using a normal CVD method and a photolithography technique. Here, the SiO₂ mask 312 is a curved striped etching mask having a thickness of approximately 400 nm and a width of approximately 1.3 μm. In particular, the mask 312 is formed so as to curve along the direction of the cavity in the region which later becomes the distributed reflector region 2. In particular, the mask 312 is formed such that the tangential angle increases in the region which later becomes the distributed reflector region 2 as the distance from the active region 1 increases (refer to FIGS. 15A to 15C).

Thereafter, etching of the semiconductor stacked structure formed in such a manner as described above is carried out to the depth to which the n-type InP substrate 301 is etched, for example, by approximately 0.7 μm, as illustrated in FIG. 17B, for example, using a dry etching method.

Consequently, the curved striped mesa structure 8 is formed in the region which later becomes the distributed reflector region 2. In the present embodiment, the mesa structure 8 having the distributed reflector region 2 curved along the direction of the cavity is formed such that the tangential angle increases as the distance from the active region 1 increases. Here, as illustrated in FIG. 15C, the tangential angle θ is approximately 0 (deg.) on the interface with the active region 1 and is approximately 12 (deg.) on the rear end face, and the tangential angle varies in a curved fashion (nonlinearly).

The mesa structure 8 having the distributed reflector region 2 whose effective diffraction grating period varies along the direction of the cavity is formed in such a manner as described above. Here, as illustrated in FIG. 15D, the effective diffraction grating period of the distributed reflector region 2 is approximately 199.505 nm on the interface with the active region 1 and is approximately 204.073 nm on the rear end face, and the period varies linearly.

Thereafter, a current blocking layer 313 made from Fe-doped type semi-insulating InP, an $SiO_2$ passivation film 114, a p-side electrode 115, an n-side electrode 116 and non-reflection coats 117 and 118 are formed as illustrated in FIGS. 17C and 18, using method similar to that of the process of the first embodiment described above, and then the device is completed.

It is to be noted that, since details of the configuration of the other part are same as those in the first embodiment described above and the modification to the first embodiment, description of them is omitted here.

Accordingly, with the semiconductor laser according to the present embodiment, a device having a distributed reflector type laser structure can be configured such that appearance of multi-mode oscillation or mode hopping can be prevented around the threshold current or where driving current is increased to increase the current injection amount. Consequently, there is an advantage that enhancement of the yield of devices with which single-longitudinal mode oscillation is obtained can be anticipated.

Actually, in the device produced by the fabrication method of the embodiment described above, stabilized single-longitudinal mode operation has been obtained wherein mode hopping does not appear around the threshold current and mode hopping does not appear up to driving current approximately 150 mA (refer to FIG. 10).

Fourth Embodiment

Now, a semiconductor laser according to a fourth embodiment is described with reference to FIGS. 19A to 23.

The semiconductor laser (DR laser) according to the present embodiment is different from that of the second embodiment described above in two points described below.

In particular, the first different point is a point that the period of a reflection diffraction grating 6D in a distributed reflector region 2A on the rear end face side is fixed and the equivalent refractive index of a passive waveguide 10 (light guide layer 408) in the distributed reflector region 2A on the rear end face side varies along the direction of the cavity as illustrated in FIG. 19A. The second different point is a point that a phase shift ($\lambda/4$ phase shift) is provided at the center of the active region 1 as illustrated in FIG. 21.

Figure 21:
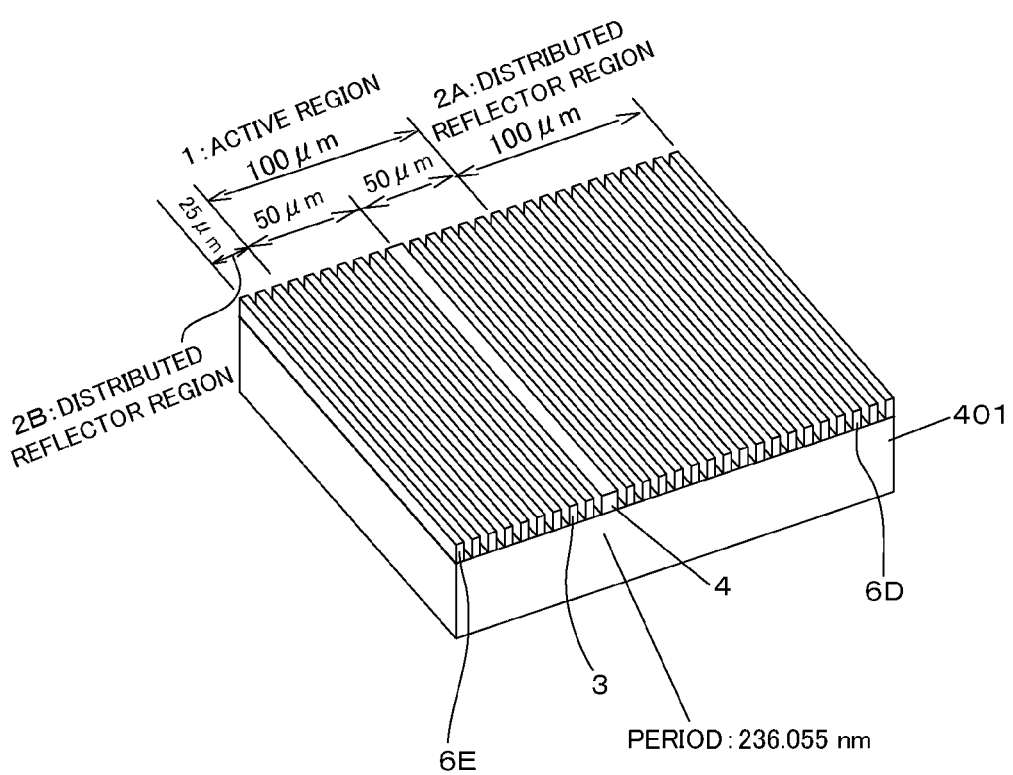
FIG. 21 is a schematic perspective view illustrating a fabrication method of the semiconductor laser according to the fourth embodiment.

In the present embodiment, all of the period of the diffraction grating 3 in the active region 1 and the periods of the reflection diffraction gratings 6D and 6E in the distributed reflector region 2 are approximately 236.055 nm and are fixed as illustrated in FIG. 21. Further, the $\lambda/4$ phase shift 4 whose phase is shifted by $\pi$ radians (corresponding to a $\lambda/4$ phase) is provided at the center of the active region 1.

Further, in the present embodiment, the effective diffraction grating period of the distributed reflector region 2A on the rear end face side varies along the direction of the cavity.

In the present embodiment, the equivalent refractive index of the passive waveguide 10 (light guide layer 408) in the distributed reflector region 2A on the rear end face side varies along the direction of the cavity as illustrated in FIG. 19B. By varying the equivalent refractive index along the direction of the cavity in the distributed reflector region 2A (passive waveguide 10 on which the reflection diffraction grating 6D is provided) on the rear end face side in this manner, the optical path length is varied along the direction of the cavity. Consequently, the effective diffraction grating period of the distributed reflector region 2A on the rear end face side is varied along the direction of the cavity.

Here, the equivalent refractive index of the distributed reflector region 2A (passive waveguide 10; light guide layer 408) on the rear end face side increases as the distance from the active region 1 increases as illustrated in FIG. 19B. Consequently, the effective diffraction grating period of the distributed reflector region 2A on the rear end face side is set so as to increase as the distance from the active region 1 increases.

Here, the effective diffraction grating period of the distributed reflector region 2A on the rear end face side is approximately 236.055 nm on the interface with the active region 1 and is approximately 239.522 nm on the rear end face, and the period varies in a curved fashion (nonlinearly).

Here, the effective diffraction grating period $\Lambda(x)$ of the distributed reflector region 2A on the rear end face side can be represented by the following expression (3). It is to be noted that the effective diffraction grating period at a position x in the distributed reflector region 2A on the rear end face side is represented by $\Lambda(x)$, the period of the reflection diffraction grating 6D is represented by $\Lambda 0$, the equivalent refractive index of the active region is represented by $neq0$, and the equivalent refractive index at the position x in the distributed reflector region 2A on the rear end face side is represented by $neq(x)$.

$$\Lambda(x) = \Lambda 0 * neq(x)/neq0 \qquad (3)$$

Therefore, the equivalent refractive index $neq(x)$ at the position x in the distributed reflector region 2A on the rear end face side is set so that the equivalent refractive index $neq(x)$ at the position x in the distributed reflector region 2A on the rear end face side varies in such a manner as illustrated in FIG. 19B as the distance from the active region 1 increases. In this instance, the equivalent refractive index $neq(x)$ at the position x in the distributed reflector region 2A on the rear end face side is approximately 3.241 on the interface with the active region 1 and is approximately 3.262 on the rear end face side, and the equivalent refractive index varies in a curved fashion (nonlinearly).

In the present embodiment, in order to vary the equivalent refractive index $neq(x)$ at the position x in the distributed reflector region 2A on the rear end face side in this manner, the width of the light guide layer 408 (passive waveguide 10) in the distributed reflector region 2A on the rear end face side is varied along the direction of the cavity as illustrated in FIG. 19A. Here, the width of the light guide layer 408 in the distributed reflector region 2A on the rear end face side is set so as to increase as the distance from the active region 1 increases.

In particular, the waveguide width $W_0$ in the distributed reflector region 2B on the front end face side and the active region 1 is set as a fixed width (here, approximately 1.5 μm). Meanwhile, the waveguide width $W(x)$ in the distributed reflector region 2A on the rear end face side is approximately 1.5 μm on the interface with the active region 1 and is approximately 4.5 μm on the rear end face, and the waveguide width becomes greater rectilinearly from the active region side toward the rear end face side.

The equivalent refractive index $neq(x)$ at the position x in the distributed reflector region 2A on the rear end face side is varied by varying the waveguide width in the distributed reflector region 2A on the rear end face side along the direction of the cavity in such a manner as described above. Consequently, the effective diffraction grating period Λ(x) at the position x in the distributed reflector region 2A on the rear end face side varies in a curved fashion (nonlinearly) from approximately 236.055 nm to approximately 239.522 nm as illustrated in FIG. 19C.

Further, as illustrated in FIG. 19C, the effective diffraction grating period of the distributed reflector region 2A on the rear end face side is approximately 236.055 nm at a position at which the distributed reflector region 2A contacts with the active region 1 and is equal to the period of the diffraction grating 3 in the active region 1.

It is to be noted that, in the embodiment described above, while the equivalent refractive index and the effective diffraction grating period are varied along the direction of the cavity by varying the waveguide width of the distributed reflector region 2A on the rear end face side along the direction of the cavity, the present invention is not limited to this. For example, in the distributed reflector region 2A on the rear end face side, the thickness of the light guide layer (waveguide core layer) 408 may be varied along the direction of the cavity. For example, in the distributed reflector region 2A on the rear end face side, the width of the light guide layer 408 may be set so as to increase as the distance from the active region 1 increases.

On the other hand, as illustrated in FIG. 19A, the waveguide width of the distributed reflector region 2B on the front end face side and the waveguide width of the active region 1 are equal to each other. In short, the equivalent refractive index of the waveguide (light guide layer) of the distributed reflector region 2B on the front end face side and the equivalent refractive index of the waveguide (active layer) of the active region 1 are equal to each other. Further, as described above, the period of the diffraction grating 3 of the active region 1 and the period of the reflection diffraction grating 6E of the distributed reflector region 2B on the front end face side are equal to each other. Therefore, the effective diffraction grating period of the active region 1 and the effective diffraction grating period of the distributed reflector region 2B on the front end face side are equal to each other.

Further, the waveguide width of the distributed reflector region 2B on the front end face side is fixed. In other words, the equivalent refractive index of the waveguide (light guide layer 408) of the distributed reflector region 2B on the front end face side is fixed. Further, the period of the reflection diffraction grating 6E of the distributed reflector region 2B on the front end face side is fixed. Therefore, the effective diffraction grating period of the distributed reflector region 2B on the front end face side is fixed.

Figure 20A:
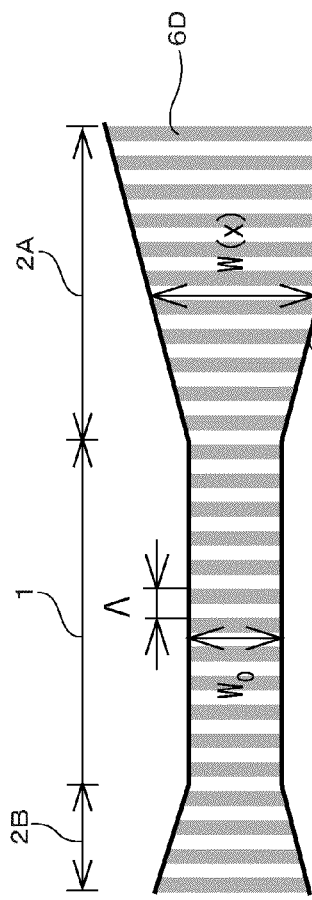
FIG. 20A is a schematic view illustrating a configuration of a waveguide portion of a semiconductor laser according to a modification to the fourth embodiment.
Figure 20B:
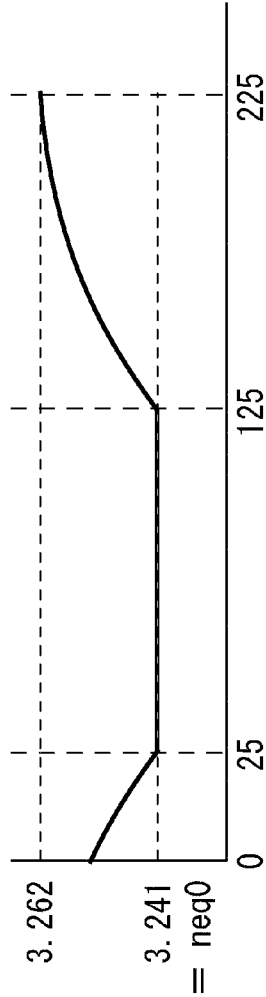
FIG. 20B is a view illustrating a variation of an equivalent refractive index in a direction of a cavity in the semiconductor laser according to the modification to the fourth embodiment.
Figure 20C:
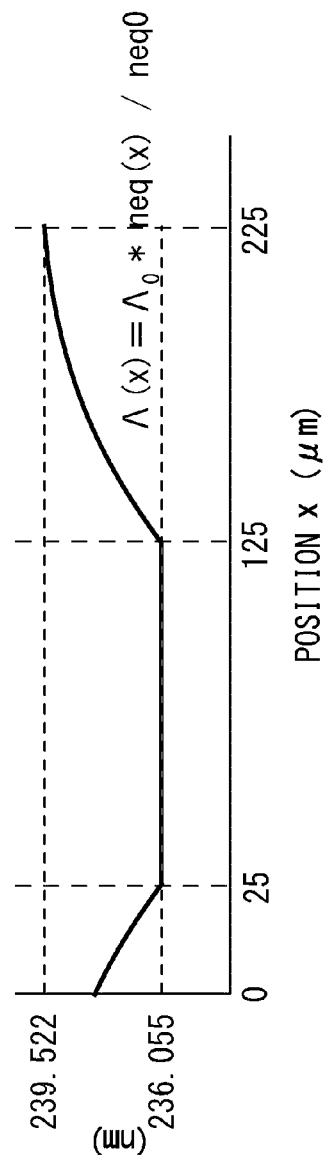
FIG. 20C is a view illustrating a variation of an effective diffraction grating period in a direction of a cavity in the semiconductor laser according to the modification to the fourth embodiment.

The reason why the effective diffraction grating period of the distributed reflector region 2B on the front end face side is fixed while the effective diffraction grating period of the distributed reflector region 2A on the rear end face side is varied along the direction of the cavity in this manner is that the length of the distributed reflector region 2B on the front end face side is set smaller in order to decrease the reflectance and as a result, the effective reflection band of the distributed reflector region is expanded. It is to be noted that, also in the distributed reflector region 2B on the front end face side, the effective diffraction grating period of the distributed reflector region may be varied along the direction of the cavity similarly as in the distributed reflector region 2A on the rear end face side described above. For example, the effective diffraction grating period of the distributed reflector region 2B on the front end face side may be set so as to increase as the distance from the active region 1 increases as illustrated in FIG. 20C. In this instance, the width of the light guide layer 408 (passive waveguide 10) in the distributed reflector region 2B on the front end face side may be set so as to increase as the distance from the active region 1 increase as illustrated in FIG. 20A. Consequently, the equivalent refractive index of the distributed reflector region 2B (passive waveguide 10; light guide layer 408) on the front end face side increases as the distance from the active region 1 increases as illustrated in FIG. 20B. As a result, the effective diffraction grating period of the distributed reflector region 2B on the front end face side increases as the distance from the active region 1 increases.

Figure 22A:
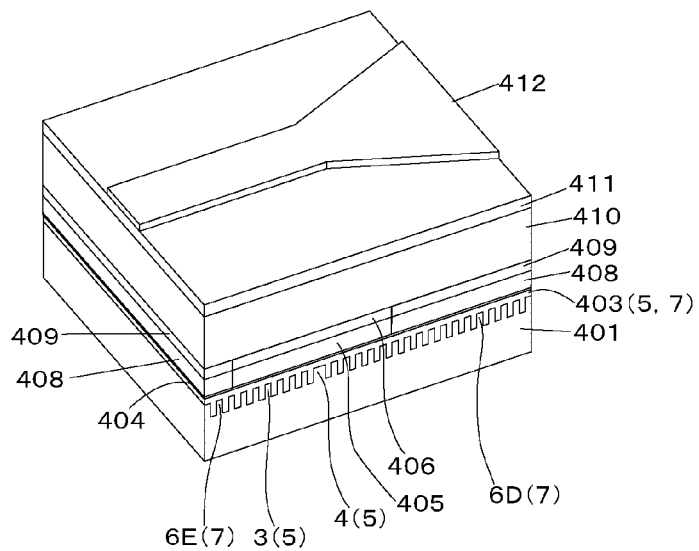
FIGS. 22A to 22C are schematic perspective views illustrating a fabrication method of the semiconductor laser according to the fourth embodiment.
Figure 22B:
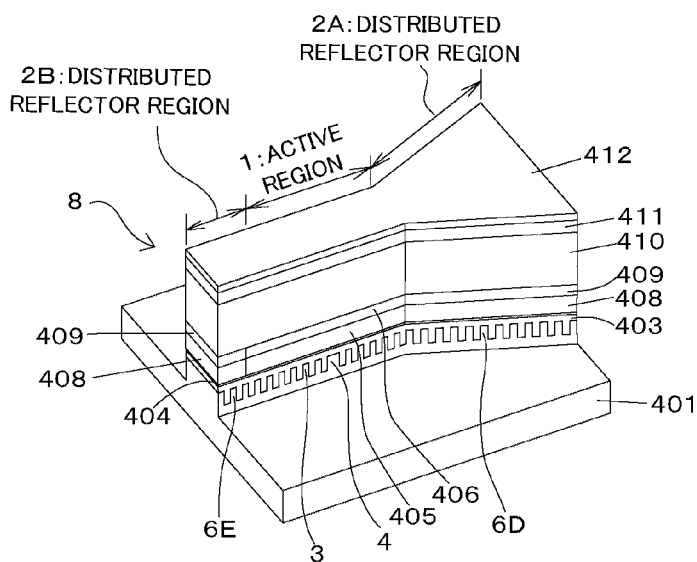
Figure 22C:
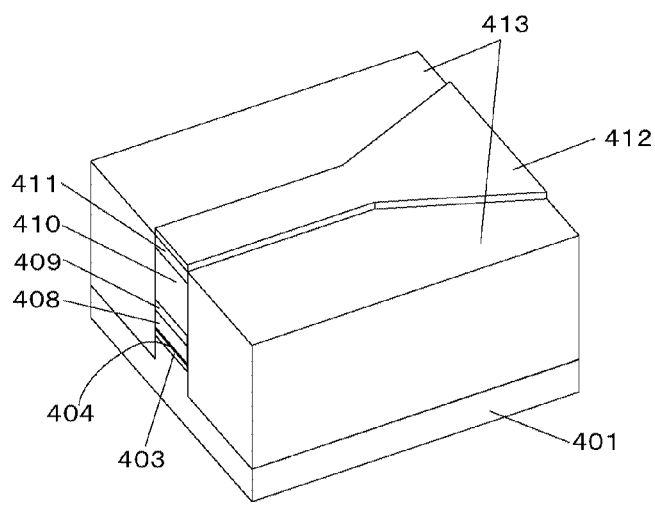
Figure 23:
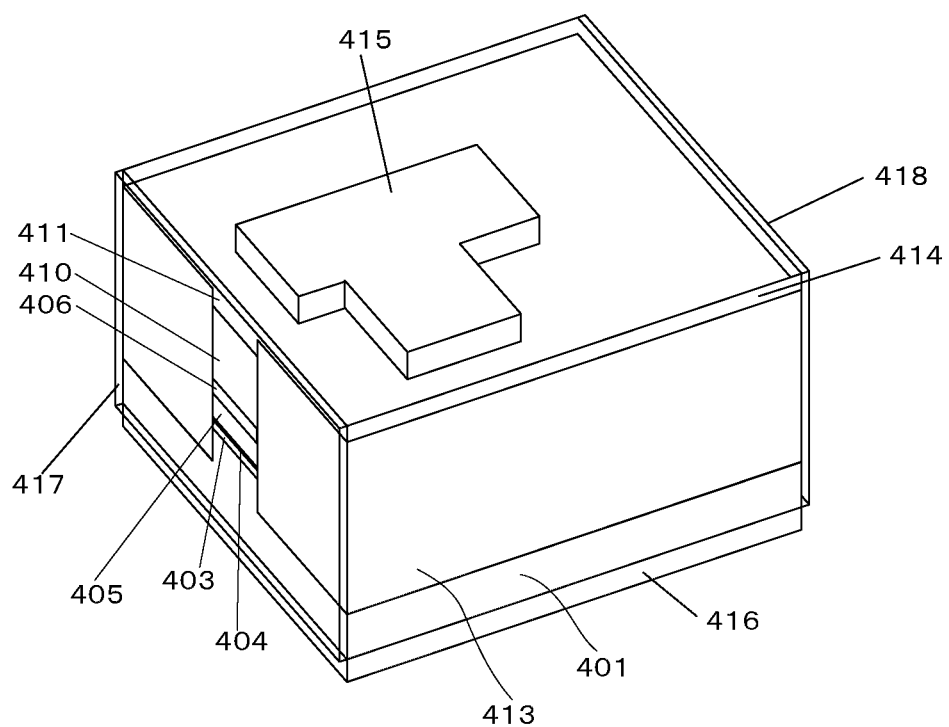
FIG. 23 is a schematic perspective view illustrating the fabrication method of the semiconductor laser according to the fourth embodiment.
Figures 24A, 24B:
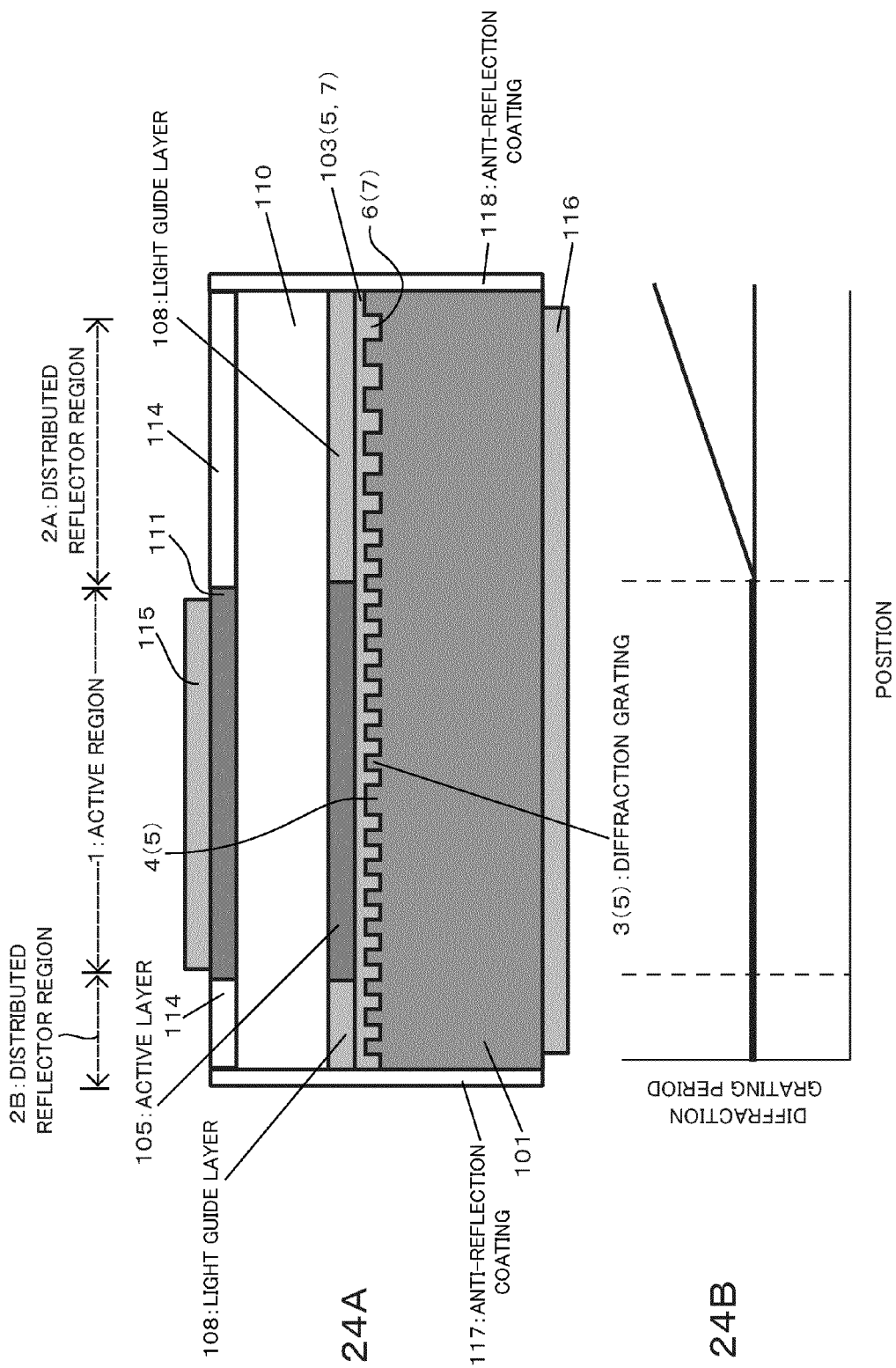
FIG. 24A is a schematic sectional view illustrating a configuration of a semiconductor laser according to a modification to the first embodiment.
FIG. 24B is a view illustrating a variation of a diffraction grating period in a direction of a cavity in the semiconductor laser according to the modification to the first embodiment.
Figures 25A, 25B:
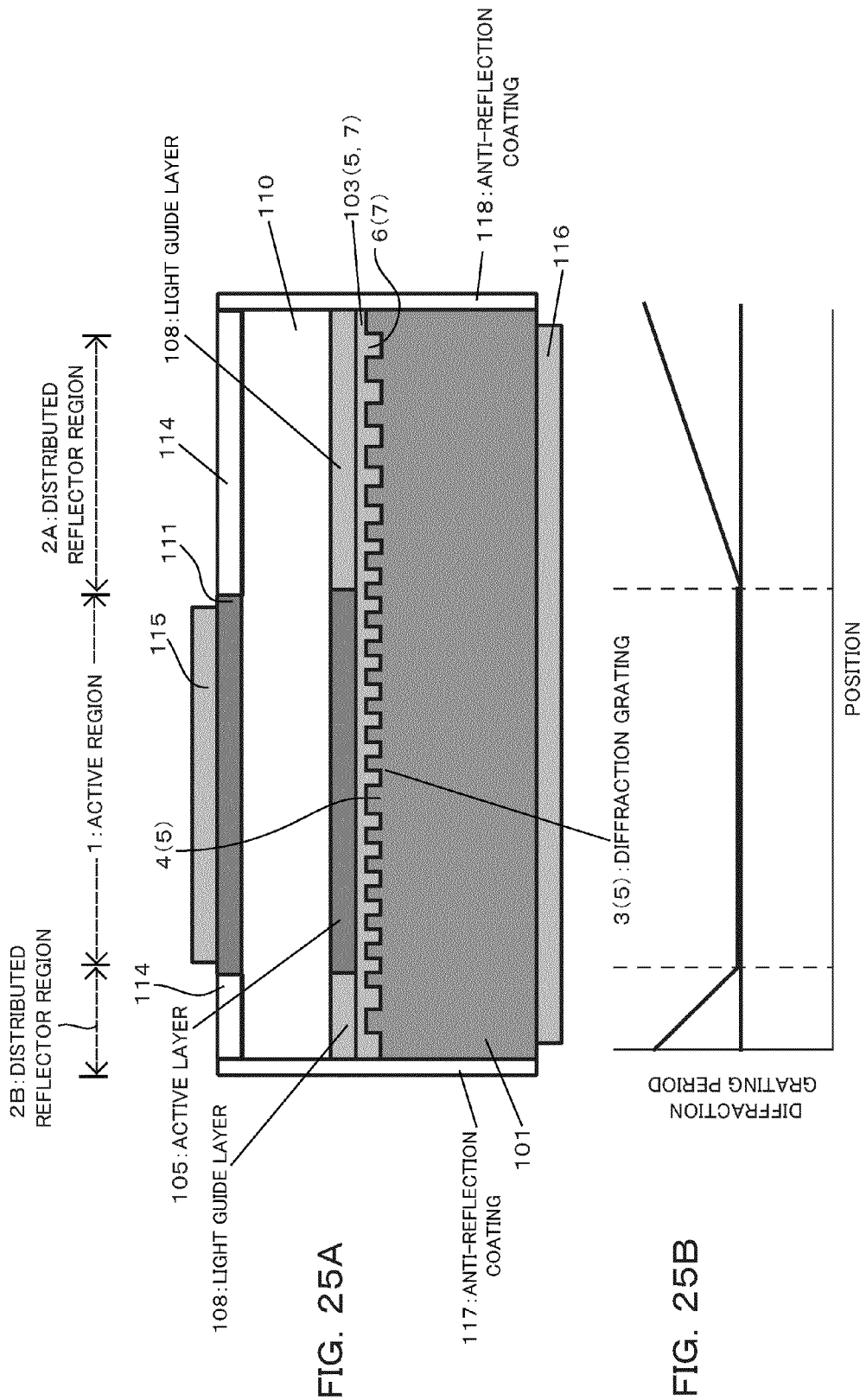
FIG. 25A is a schematic sectional view illustrating a configuration of a semiconductor laser according to a different modification to the first embodiment.
FIG. 25B is a view illustrating a variation of a diffraction grating period in a direction of a cavity in the semiconductor laser according to the different modification to the first embodiment.
Figures 26A, 26B:
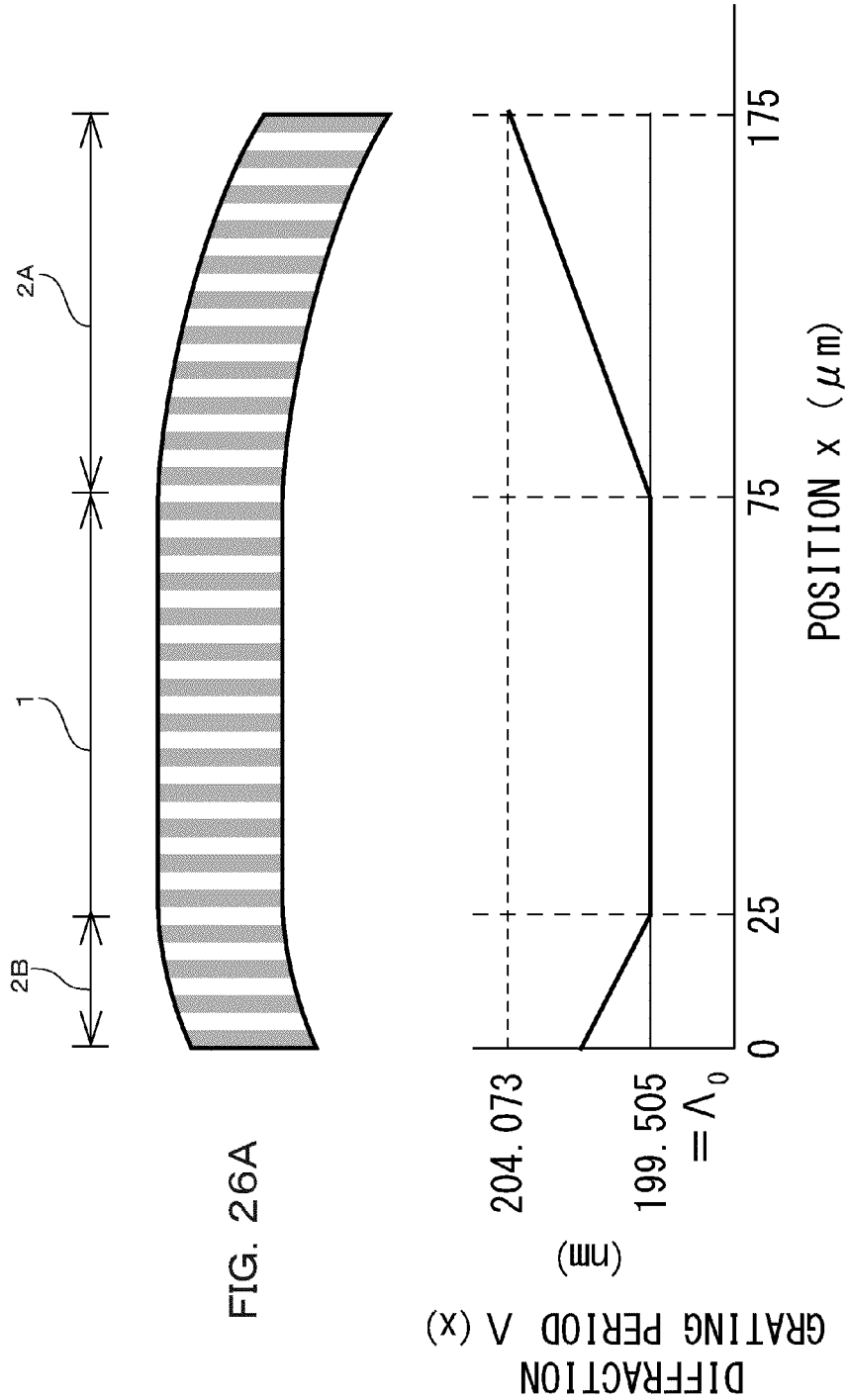
FIG. 26A is a schematic top plan view illustrating a configuration of a waveguide portion of a semiconductor laser according to a modification to the third embodiment.
FIG. 26B is a view illustrating a variation of a diffraction grating period in a direction of a cavity in the semiconductor laser according to the modification to the third embodiment.

It is to be noted that, as illustrated in FIGS. 21 to 23, the present semiconductor laser includes the active region 1 and the distributed reflector regions 2A and 2B. Further, the active region 1 includes a diffraction grating layer 5 which includes the diffraction grating 3 including the phase shift 4 formed on the surface of an n-type doped InP substrate 401 and an n-type doped GaInAsP layer 403, an n-type doped InP layer 404, an undoped AlGaInAs/AlGaInAs quantum well active layer 405, a p-type doped InP cladding layer 406, a p-type InP cladding layer 410, and a p-type GaInAs contact layer 411. Further, the distributed reflector regions 2A and 2B include a reflection diffraction grating layer 7 including reflection diffraction gratings 6D and 6E formed on the surface of the n-type doped InP substrate 401 and an undoped GaInAsP layer 403, an n-type doped InP layer 404, an undoped GaInAsP light guide layer (passive waveguide core layer) 408, an undoped InP layer 409, and the p-type InP cladding layer 410. Further, since current injection is carried out only to the active region 1, a current injection electrode (p-side electrode) 415 is provided only in the active region 1. Further, an n-side electrode 416 is provided on the reverse face side of the n-type doped InP substrate 401. Further, in the present distribution reflection type laser, anti-reflection coatings (anti-reflection films) 417 and 418 are provided on both end faces. It is to be noted that, in FIG. 23, reference numeral 414 denotes a $SiO_2$ passivation film.

Now, a fabrication method of the semiconductor layer (DR laser) according to a particular example of the configuration of the present embodiment is described with reference to FIGS. 21 to 23.

First, the processes up to the process of stacking the p-type GaInAs contact layer 411 except the process of forming the diffraction grating 3 including the phase shift 4 and the reflection diffraction gratings 6D and 6E on the surface of the n-type InP substrate 401 are similar to that of the processes (refer to FIGS. 12C to 12D and 13A to 13C) of the second embodiment described hereinabove.

In the present embodiment, the process of forming the diffraction grating 3 including the phase shift 4 and the reflection diffraction gratings 6D and 6E on the surface of the n-type InP substrate 401 is carried out in such a manner as described below.

In particular, the diffraction grating 3 having the λ/4 phase shift 4 whose phase is shifted by π radians (corresponding to a λ/4 shift) at the center of the active region 1 and having a fixed period is formed over the overall length (here, approximately 100 μm) of the region which later becomes the active region 1 of the individual devices. Here, the period of the diffraction grating 3 is approximately 236.055 nm. Further, continuing to the diffraction grating 3 in the active region 1, the reflection diffraction gratings 6D and 6E having a period equal to the period of the diffraction grating 3 in the active region 1 and having a fixed period are formed over the overall length (here, approximately 100 μm) of the region which later becomes the distributed reflector region 2A on the rear end face side and the overall length (here, approximately 25 μm) of the region which later becomes the distributed reflector region 2B on the front end face side. Here, both of the periods of the reflection diffraction gratings 6D and 6E are approximately 236.055 nm.

Then, the processes up to the process of stacking the p-type GaInAs contact layer 411 are carried out using a method similar to that of the processes (refer to FIGS. 12C to 12D and 13A to 13C) of the second embodiment described hereinabove.

Thereafter, a $SiO_2$ mask 412 is formed on the surface of the p-type GaInAs contact layer 411 as illustrated in FIG. 22A, for example, using a normal CVD method and a photolithography technique. Here, a striped etching mask having a thickness of approximately 400 nm is formed as the $SiO_2$ mask 412. Particularly, the $SiO_2$ mask 412 has a fixed width (here, approximately 1.5 μm) in the region which later becomes the active region 1 and the region which later becomes the distributed reflector region 2B on the front end side. Further, in the region which later becomes the distributed reflector region 2A on the rear face side, the $SiO_2$ mask 412 has a width of approximately 1.5 μm on the active region side and has another width of approximately 4.5 μm on the rear end face side, and the width becomes greater rectilinearly from the active region side toward the rear end face side.

Thereafter, the semiconductor stacked structure formed in such a manner as described above is etched, for example, using a dry etching method, to the depth to which the n-type InP substrate 401 is etched, for example, by approximately 0.7 μm.

Consequently, the striped mesa structure 8 whose waveguide width increases along the direction of the cavity is formed in the region which later becomes the distributed reflector region 2A on the rear end face side.

In the present embodiment, the mesa structure 8 having the distributed reflector region 2A on the rear end face side whose waveguide width increases as the distance from the active region 1 increases. Here, the waveguide width is approximately 1.5 μm on the interface with the active region 1 and approximately 4.5 μm on the rear end face, and varies in a form of a straight line (linearly).

The mesa structure 8 whose equivalent refractive index increases along the direction of the cavity is formed in this manner in the region which later becomes the distributed reflector region 2A on the rear end face side. Here, the equivalent refractive index of the distributed reflector region 2A on the rear end face side is approximately 3.241 on the interface with the active region 1 and approximately 3.262 on the rear end face and varies in a curved fashion (nonlinearly) as illustrated in FIG. 19B.

Consequently, the mesa structure 8 having the distributed reflector region 2A on the rear end side whose effective diffraction grating period varies along the direction of the cavity is formed. Here, the effective diffraction grating period of the distributed reflector region 2A on the rear end face side is approximately 236.055 nm on the interface with the active region 1 and approximately 239.522 nm on the rear end face and varies in a curved fashion (nonlinearly) as illustrated in FIG. 19C.

Thereafter, a current blocking layer 413 made from Fe-doped type semi-insulating InP, a $SiO^2$ passivation film 414, a p-side electrode 415, an n-side electrode 416, and anti-reflection coatings 417 and 418 are formed by a similar method to that used in the second embodiment described hereinabove, and the device is completed thereby.

It is to be noted that details of the other part are similar to those in the second embodiment and the modification to the second embodiment described hereinabove, and therefore, description of them is omitted here.

Accordingly, with the semiconductor layer according to the present embodiment, a device having a distributed reflector type laser structure can be configured such that occurrence of multi-mode oscillation or mode hopping can be prevented around the threshold current or where driving current is gradually increased to increase the current injection amount. Consequently, there is an advantage that enhancement of the yield of devices with which single-longitudinal mode oscillation is obtained can be anticipated.

Actually, in the device produced by the fabrication method of the embodiment described above, stabilized single-longitudinal mode operation was obtained wherein mode hopping does not appear around the threshold current and mode hopping does not appear up to driving current approximately 150 mA (refer to FIG. 10).

Others

Further, the present invention is not limited to the structures described in the description of the embodiments specifically described above, and variations and modifications can be made without departing from the scope of the present invention.

It is to be noted that, while the embodiments and the modifications described above are described taking the case wherein the distributed reflector region is provided on the rear end face side of the active region (first and third embodiments) and the case wherein the distributed reflector region is provided on the opposite end face sides of the active region (second and fourth embodiments) as examples, the present invention is not limited to them.

For example, in the devices of the first and third embodiments, the distributed reflector regions 2A and 2B may be provided so as to continue to the rear end face side and the front end face side (both end face sides) of the active region 1 as illustrated in FIGS. 24A to 26B. In this instance, also in the distributed reflector region 2B on the front end face side, the effective diffraction grating period may vary along the direction of the cavity (refer to FIGS. 25A, 25B, 26A, and 26B) similarly as in the distributed reflector region 2A on the rear end face side in the first and third embodiments described hereinabove. Further, in the devices of the second and fourth embodiments, the distributed reflector region may be provided in such a manner as to continue to the rear end face side of the active region.

Figures 27A, 27B:
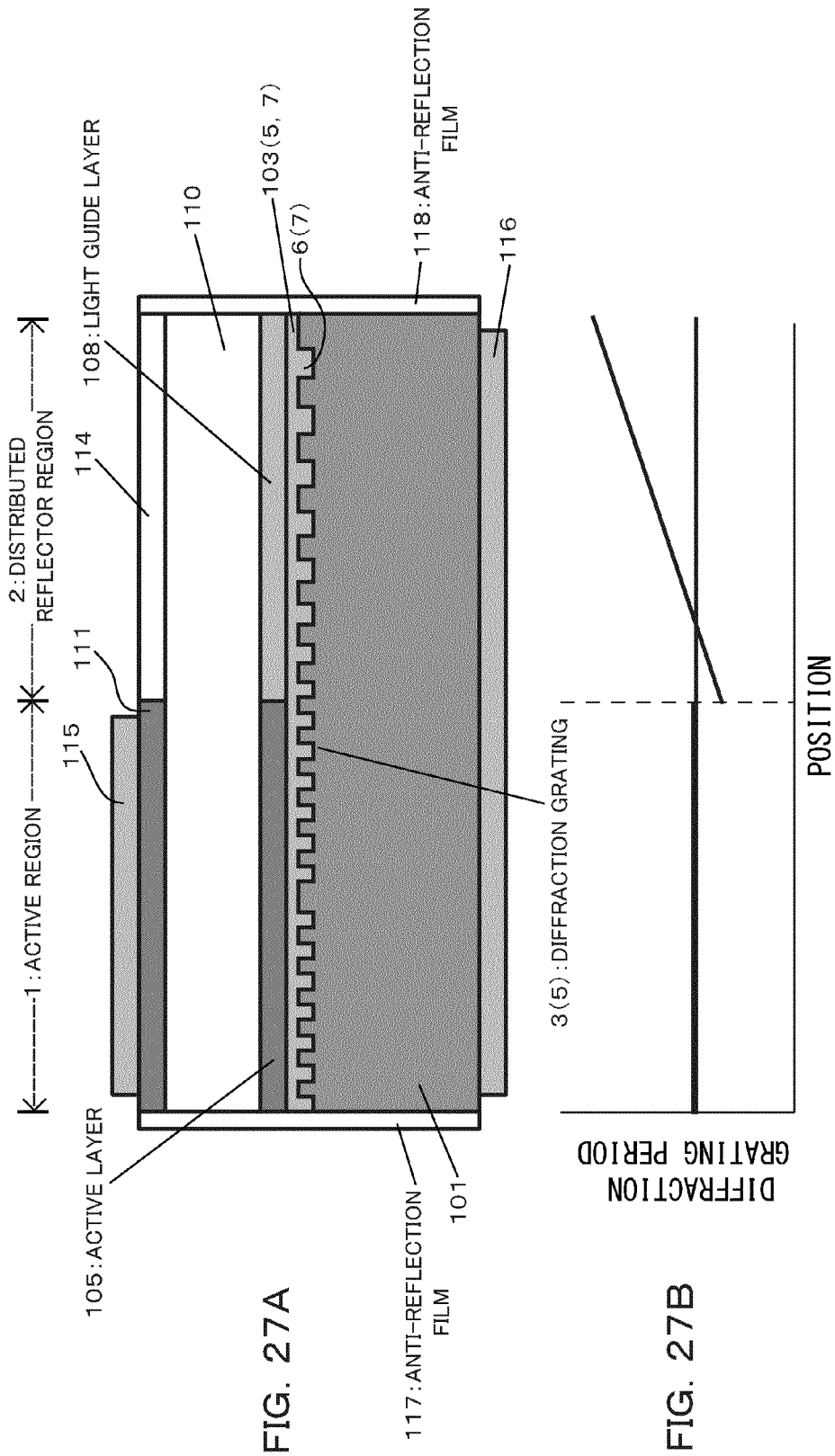
FIG. 27A is a schematic sectional view illustrating a configuration of a semiconductor laser according to a different modification to the first embodiment.
FIG. 27B is a view illustrating a variation of a diffraction grating period in a direction of a cavity in the semiconductor laser according to the different modification to the first embodiment.
Figure 28:
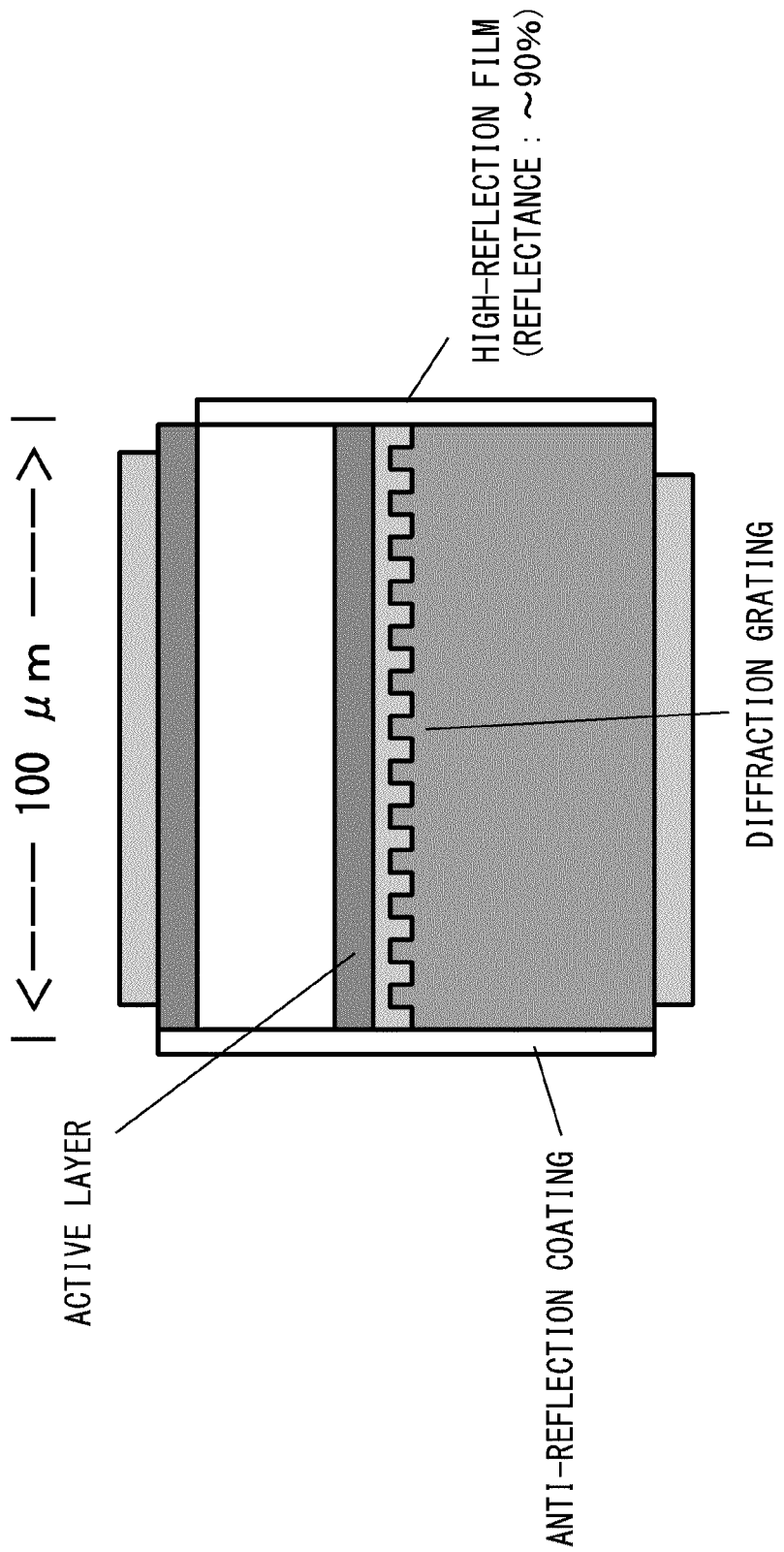
FIG. 28 is a schematic sectional view illustrating a configuration of a conventional semiconductor laser.

Further, the first embodiment and the modification to the first embodiment described above are described taking the case wherein the effective diffraction grating period of the distributed reflector region is longer on the interface with the active region than the diffraction grating period of the active region as an example. Further, the second, third and fourth embodiments are described taking the case wherein the effective diffraction grating period of the distributed reflector region is equal on the interface with the active region to the diffraction grating period of the active region as an example. However, the present invention is not limited to them. For example, the effective diffraction grating period of the distributed reflector region 2 may be shorter than the period of the diffraction grating 3 in the active region 1 on the interface with the active region 1 as illustrated in FIGS. 27A and 27B. For example, the period of the reflection diffraction grating 6 in the distributed reflector region 2 may be shorter than the period of the diffraction grating 3 in the active region 1 at the position at which the distributed reflector region 2 contacts with the active region 1. Also in this instance, the mode stability can be improved similarly as in the embodiments and the modifications described above except the point that the threshold current rises. It is to be noted that a device wherein the period of the reflection diffraction grating is shorter than the period of the diffraction grating in the active region at the position at which the distributed reflector region contacts with the active region is suitable for a laser having a high threshold current, that is, a laser having a great shift (temperature drift by a plasma effect) of the Bragg wavelength to the short wavelength side.

Further, the first embodiment and the modification described above are described taking the case wherein the period of the reflection diffraction grating is varied linearly as an example. Further, the second embodiment and the modification described above are described taking the case wherein the period of the reflection diffraction grating on the rear end side is varied nonlinearly as an example. Further, the third embodiment and the modification described above are described taking the case wherein the effective diffraction grating period of the distributed reflector region on the rear end face side is varied linearly as an example. Further, the fourth embodiment and the modification described above are described taking the case wherein the effective diffraction grating period of the distributed reflector region on the rear end face side is varied in a curved fashion (nonlinearly) as an example. However, the present invention is not limited to them. For example, a function representative of a periodical variation of a reflection diffraction grating, a function representative of a curvature variation (variation of the tangential angle) of a waveguide, and a function representative of a variation of an equivalent refractive index have a degree of freedom in design, and a different function may be applied in accordance with the design of a device. Further, where the waveguide width is varied as in the fourth embodiment described above, the manner of increase of the waveguide width is not limited to a rectilinear variation but has a degree of freedom in design.

Further, while the embodiments and the modifications are described taking the case wherein the duty ratio (top/bottom ratio) of the diffraction grating is approximately 50%, the duty ratio is not limited to this, and depending upon the design of a device, the duty ratio may vary.

Further, the first and third embodiments and the modifications to the first and third embodiments described above are described taking the semiconductor laser (DR laser) which includes a quantum well active layer formed using an AlGaInAs compound semiconductor material systems on an n-type InP substrate as an example. Further, the second and fourth embodiments and the modification to the second and fourth embodiments described above are described taking the semiconductor laser (DR laser) which includes a quantum well active layer formed using a GaInAsP compound semiconductor material systems on an n-type InP substrate as an example. However, the present invention is not limited to them, but can be applied widely to semiconductor lasers wherein a diffraction grating is provided in the proximity of a waveguide.

For example, in the devices of the first and third embodiments, the quantum well active layer may be formed using a GaInAsP compound semiconductor material systems, and in the second and fourth embodiments, the quantum well active layer may be formed using an AlGaInAs compound semiconductor material systems. Further, the quantum well active layer may be formed using some other compound semiconductor material systems such as, for example, a GaInNAS compound semiconductor material systems. Also in those cases, similar effects to those of the embodiments and the modifications to the embodiments described hereinabove can be achieved.

Further, for example, for the material for the devices, a material which can form a semiconductor laser may be used. For example, some other compound semiconductor material may be used. Further, not only semiconductor materials but also organic materials and inorganic materials can be used. Also in those cases, similar effects to those of the embodiments and the modifications to the embodiments described above can be achieved.

Further, for example, for the substrate, a substrate having the p-type conductivity may be used. In this instance, all of the layers formed on the substrate have the opposite conductivity to those described hereinabove. Further, a semi-insulating substrate may be used. Furthermore, the semiconductor laser may be produced, for example, by a method of lamination on a silicon substrate. Also in those cases, similar effects to those of the embodiments and the modifications to the embodiments described above can be achieved.

Further, for example, a GaAs substrate may be used, and the layers may be formed using semiconductor materials whose crystal growth (for example, epitaxial growth) is possible on the GaAs substrate. Also in this instance, similar effects to those of the embodiments and the modifications to the embodiments described above can be achieved.

Further, some other active layer structure such as, for example, a bulk active layer which uses a bulk type semiconductor material or a quantum dot active layer may be adopted. Also in this instance, similar effects to those of the embodiments and the modifications to the embodiments described above can be achieved.

Further, the embodiments and the modifications described hereinabove are described taking the case which uses a current blocking structure formed using a semi-insulating buried structure (SI-BH structure) as an example. However, the present invention is not limited to them, but it is possible to adopt a current blocking structure formed using some other buried structure such as, for example, a current blocking structure formed using a pnpn thyristor structure.

Furthermore, while the embodiments and the modifications described hereinabove are described taking the case wherein a buried waveguide structure is used as an example, it is also possible to use some other waveguide structure such as a ridge type waveguide structure.

Further, the embodiments and the modifications to the embodiments described hereinabove are described taking the surface diffraction grating structure formed on the surface of a substrate as an example. However, the present invention is not limited to them, but also it is possible to use a buried type diffraction grating structure formed by burying a semiconductor layer having grooves periodically formed with another semiconductor layer.

Further, the embodiments and the modifications to the embodiments described hereinabove are described taking the case wherein a diffraction grating is provided on the lower side (substrate side with respect to the waveguide core layer) of a waveguide core layer (active layer or light guide layer) as an example. However, the present invention is not limited to them, and the diffraction grating may be mounted, for example, on the upper side with respect to the waveguide core layer (on the opposite side to the substrate with respect to the waveguide core layer). Also in this instance, similar effects to those of the embodiments described above can be achieved.

Further, while, in the embodiments and the modifications to the embodiments described hereinabove, the phase shift is provided at the central position of the active region or at a position displaced from the center, the present invention is not limited to this, and the position of the phase shift can be set arbitrarily within a range of design if it remains in the active region.

Further, while the embodiments and the modifications to the embodiments described hereinabove are described taking the case wherein only one phase shift is provided as an example, the present invention is not limited to this, but, for example, another structure which includes a plurality of phase shifts may be used. The quantity of one or a plurality of phase shifts can be set arbitrarily.

Further, while, in the embodiments and the modifications to the embodiments described hereinabove, the values of the coupling coefficient of the active region and the distributed reflector region are equal to each other, the present invention is not limited to this, but the values may be different from each other depending upon the design of a device.

Further, while it is described that the embodiments described above are independent of one another, the present invention is not limited to this, but, for example, the devices of the embodiments can be combined arbitrarily. For example, the device of the first embodiment (or the device of the second embodiment) and the device of the third embodiment may be combined such that, in the device of the third embodiment, the period of the reflection diffraction grating is varied along the direction of the cavity. Or, for example, the device of the first embodiment (or the device of the second embodiment) and the device of the fourth embodiment may be combined such that, in the device of the fourth embodiment, the period of the reflection diffraction grating is varied along the direction of the cavity. Or else, the device of the first embodiment (or the device of the second embodiment), the device of the third embodiment and the device of the fourth embodiment may be combined. Further, for example, the device of the third embodiment and the device of the fourth embodiment may be combined.

Further, although, in the embodiments and the modifications described hereinabove, any difference in composition between the active region and the distributed reflector region is not taken into consideration, the period of the diffraction grating may be made different between the diffraction grating in the active region and the reflection diffraction grating in the distributed reflector region depending upon the difference in composition between the active region and the distributed reflector region. For example, the period of the diffraction grating in the active region and the period of the reflection diffraction grating in the distributed reflector region at the position at which the active region and the distributed reflector region contact with each other may be set in accordance with the difference in composition between the active region and the distributed reflector region.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A semiconductor laser, comprising:
a distributed feedback laser region including an active layer, and a diffraction grating and a phase shift which determine a single oscillation wavelength and provided over or under the active layer, the distributed feedback laser region being a current injection region; and
a distributed reflector region including a passive waveguide core layer jointed to an end face of the active layer and a reflection diffraction grating provided over or under the passive waveguide core layer and continuing to the diffraction grating, the distributed reflector region being a no-current injection region; and wherein
the diffraction grating in the distributed feedback laser region has a fixed period;
the distributed reflector region has an effective diffraction grating period which varies along a direction of a cavity; and
the effective diffraction grating period of the distributed reflector region becomes longer as a distance from the distributed feedback laser region increases over the entire region.

2. The semiconductor laser as claimed in claim 1, wherein a current injection electrode is provided only in the distributed feedback laser region.

3. The semiconductor laser as claimed in claim 1, wherein, in the distributed reflector region, the reflection diffraction grating has a period which varies along the direction of the cavity.

4. The semiconductor laser as claimed in claim 1, wherein the distributed reflector region has an optical path length which varies along the direction of the cavity.

5. The semiconductor laser as claimed in claim 4, wherein the distributed reflector region is curved along the direction of the cavity.

6. The semiconductor laser as claimed in claim 5, wherein, in the distributed reflector region, a tangential angle of the passive waveguide core layer increases as a distance from the distributed feedback laser region increases.

7. The semiconductor laser as claimed in claim 4, wherein, in the distributed reflector region, the passive waveguide core layer has an equivalent refractive index which varies along the direction of the cavity.

8. The semiconductor laser as claimed in claim 7, wherein, in the distributed reflector region, the equivalent refractive index of the passive waveguide core layer increases as a distance from the distributed feedback laser region increases.

9. The semiconductor laser as claimed in claim 7, wherein, in the distributed reflector region, the passive waveguide core layer has a width which varies along the direction of the cavity.

10. The semiconductor laser as claimed in claim 1, wherein the distributed reflector region has the reflection diffraction grating which has a fixed period and an optical path length which varies along the direction of the cavity.

11. The semiconductor laser as claimed in claim 1, wherein, in the distributed reflector region, the effective diffraction grating period is equal to or longer than a period of the diffraction grating of the distributed feedback laser region at a position at which the distributed reflector region contacts with the distributed feedback laser region.

12. The semiconductor laser as claimed in claim 1, wherein, in the distributed reflector region, the effective diffraction grating period is equal to or shorter than a period of the diffraction grating of the distributed feedback laser region at a position at which the distributed reflector region contacts with the distributed feedback laser region.

13. The semiconductor laser as claimed in claim 1, wherein the distributed reflector region is provided on one end side of the distributed feedback laser region.

14. The semiconductor laser as claimed in claim 1, wherein the distributed reflector region is provided on both end sides of the distributed feedback laser region in such a manner as to sandwich the distributed feedback laser region.

15. The semiconductor laser as claimed in claim 14, wherein one of the distributed reflector regions on both end sides of the distributed feedback laser region has a length in the direction of the cavity which is shorter than that of the other one of the distributed reflector regions.

16. The semiconductor laser as claimed in claim 1, wherein the diffraction grating of the distributed feedback laser region and the reflection diffraction grating of the distributed reflector region have an equal coupling coefficient.

17. The semiconductor laser as claimed in claim 1, wherein the distributed reflector region is provided on both end sides of the distributed feedback laser region in such a manner as to sandwich the distributed feedback laser region and further has anti-reflection coatings provided on both end faces thereof.

18. The semiconductor laser as claimed in claim 1, wherein the phase shift is a $\lambda/4$ phase shift provided on the diffraction grating.

* * * * *